United States Patent
Iwao et al.

(10) Patent No.: US 11,211,264 B2
(45) Date of Patent: Dec. 28, 2021

(54) SUBSTRATE PROCESSING APPARATUS AND SUBSTRATE PROCESSING METHOD

(71) Applicant: SCREEN Holdings Co., Ltd., Kyoto (JP)

(72) Inventors: Michinori Iwao, Kyoto (JP); Ryo Muramoto, Kyoto (JP)

(73) Assignee: SCREEN Holdings Co., Ltd.

( * ) Notice: Subject to any disclaimer, the term of this patent is extended or adjusted under 35 U.S.C. 154(b) by 727 days.

(21) Appl. No.: 16/071,104

(22) PCT Filed: Dec. 26, 2016

(86) PCT No.: PCT/JP2016/088671
§ 371 (c)(1),
(2) Date: Jul. 19, 2018

(87) PCT Pub. No.: WO2017/138274
PCT Pub. Date: Aug. 17, 2017

(65) Prior Publication Data
US 2021/0175098 A1 Jun. 10, 2021

(30) Foreign Application Priority Data
Feb. 9, 2016 (JP) .............................. JP2016-022449

(51) Int. Cl.
*H01L 21/67* (2006.01)
*H01L 21/02* (2006.01)
*H01L 21/311* (2006.01)

(52) U.S. Cl.
CPC .... *H01L 21/67034* (2013.01); *H01L 21/0206* (2013.01); *H01L 21/31133* (2013.01); *H01L 21/6708* (2013.01)

(58) Field of Classification Search
CPC ......... H01L 21/67017; H01L 21/67034; H01L 21/0206; H01L 21/6708; H01L 21/31133
See application file for complete search history.

(56) References Cited

U.S. PATENT DOCUMENTS 5,846,327 A * 12/1998 Kawamoto ............. B05C 11/08
118/319
5,908,657 A * 6/1999 Kimura .................. B05D 1/005
427/9

(Continued)

FOREIGN PATENT DOCUMENTS

EP       1522517 A1    4/2005
JP    2002-184660 A    6/2002
(Continued)

OTHER PUBLICATIONS

Decision to Grant a Patent dated Jun. 18, 2020 for Korean Patent Application No. 10-2018-7021260 with English translation.

(Continued)

*Primary Examiner* — Jarrett J Stark
(74) *Attorney, Agent, or Firm* — Ostrolenk Faber LLP

(57) ABSTRACT

A substrate rotation mechanism rotates the substrate holder about a central axis. A top plate opposes the upper surface of the substrate and rotates about the central axis. A gas supply part supplies a treatment atmospheric gas to a radial central part of a lower space that is a space below the top plate. An ion generator generates and supplies ions to the treatment atmospheric gas supplied from the gas supply part. Then, in a state in which the top plate is positioned lower than when the substrate is transported into the apparatus, the treatment atmospheric gas that contains the ions is supplied to the lower space to form an ion stream that spreads radially outward from the radial central part of the lower space while rotating the substrate holder and the top plate. Accordingly, charges can be dissipated from the top plate with a simple structure.

8 Claims, 9 Drawing Sheets

(56) References Cited

U.S. PATENT DOCUMENTS

| | | | | |
|---|---|---|---|---|
| 6,159,541 | A * | 12/2000 | Sakai | B05C 11/08 427/240 |
| 6,248,169 | B1 * | 6/2001 | Juang | B05B 14/00 118/52 |
| 6,589,338 | B1 * | 7/2003 | Nakamori | H01L 21/67051 118/50 |
| 7,837,803 | B2 * | 11/2010 | Hohenwarter | H01L 21/6708 134/21 |
| 8,375,887 | B2 * | 2/2013 | Takayanagi | H01L 21/67051 118/326 |
| 9,159,593 | B2 * | 10/2015 | Kawaguchi | B08B 3/10 |
| 9,484,229 | B2 * | 11/2016 | Lach | H01L 21/67017 |
| 9,698,029 | B2 * | 7/2017 | Schwarzenbacher | H01L 21/6715 |
| 9,779,979 | B2 * | 10/2017 | Schwarzenbacher | H01L 21/68742 |
| 10,490,427 | B2 * | 11/2019 | Choi | H01L 21/67115 |
| 2002/0112662 | A1 * | 8/2002 | Yamauchi | H01L 21/67017 118/52 |
| 2004/0050491 | A1 * | 3/2004 | Miya | H01L 21/6708 156/345.11 |
| 2004/0197433 | A1 * | 10/2004 | Terada | H01L 21/6708 425/174.4 |
| 2004/0235308 | A1 | 11/2004 | Sato et al. | 438/704 |
| 2006/0182882 | A1 * | 8/2006 | Takahashi | G11B 7/266 427/240 |
| 2008/0173327 | A1 | 7/2008 | Miyagi | 134/1.3 |
| 2009/0162547 | A1 * | 6/2009 | Sawada | H01L 21/6715 427/240 |
| 2010/0214712 | A1 | 8/2010 | Yamawaku et al. | 361/213 |
| 2014/0238443 | A1 * | 8/2014 | Lee | H01L 21/6708 134/21 |
| 2014/0290703 | A1 | 10/2014 | Kobayashi et al. | 134/33 |
| 2015/0075571 | A1 * | 3/2015 | Miura | H01L 21/6708 134/99.1 |
| 2015/0234296 | A1 * | 8/2015 | Yagi | H01L 21/6708 355/72 |
| 2019/0221450 | A1 * | 7/2019 | Negoro | H01L 21/67017 |
| 2019/0366394 | A1 * | 12/2019 | Yoshida | H01L 21/67051 |
| 2021/0057235 | A1 * | 2/2021 | Negoro | H01L 21/6708 |
| 2021/0151332 | A1 * | 5/2021 | Endo | H01L 21/6708 |

FOREIGN PATENT DOCUMENTS

| | | |
|---|---|---|
| JP | 2003-100694 A | 4/2003 |
| JP | 2004-327613 A | 11/2004 |
| JP | 2004-356317 A | 12/2004 |
| JP | 2005-112552 A | 4/2005 |
| JP | 2008-153322 A | 7/2008 |
| JP | 2009-004596 A | 1/2009 |
| JP | 2010-199239 A | 9/2010 |
| KR | 10-2014-0118850 A | 10/2014 |
| KR | 10-2015-0097390 A | 8/2015 |

OTHER PUBLICATIONS

PCT/IB/326 Notification Concerning Transmittal of International Preliminary Report on Patentability including PCT/IB/373 and PCT/fSA/237 (in Japanese) dated Aug. 23, 2018 for International Application No. PCT/JP2016/088671.
PCT/IB/338 Notification of Transmittal of Translation of the International Preliminary Report on Patentability including PCT/IB/373 and PCT/ISA/237 (in English) dated Aug. 23, 2018 for International Application No. PCT/JP2016/088671.
Decision to Grant a Patent dated May 13, 2020 for Japanese Patent Application No. 2016-022449 with English translation.
International Search Report dated Mar. 28, 2017 in corresponding PCT International Application No. PCT/JP2016/088671.
Written Opinion dated Mar. 28, 2017 in corresponding PCT International Application No. PCT/JP2016/088671.

* cited by examiner

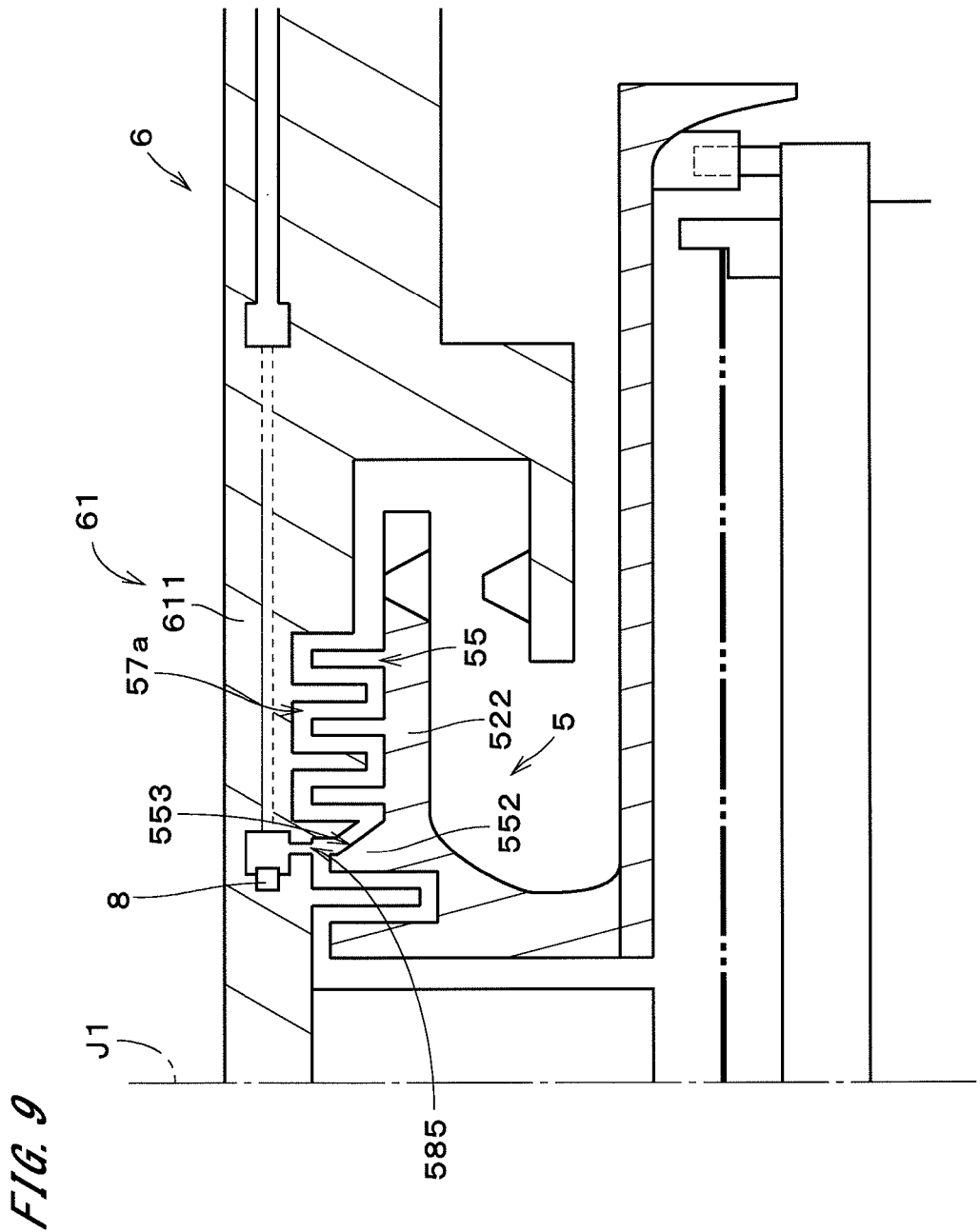

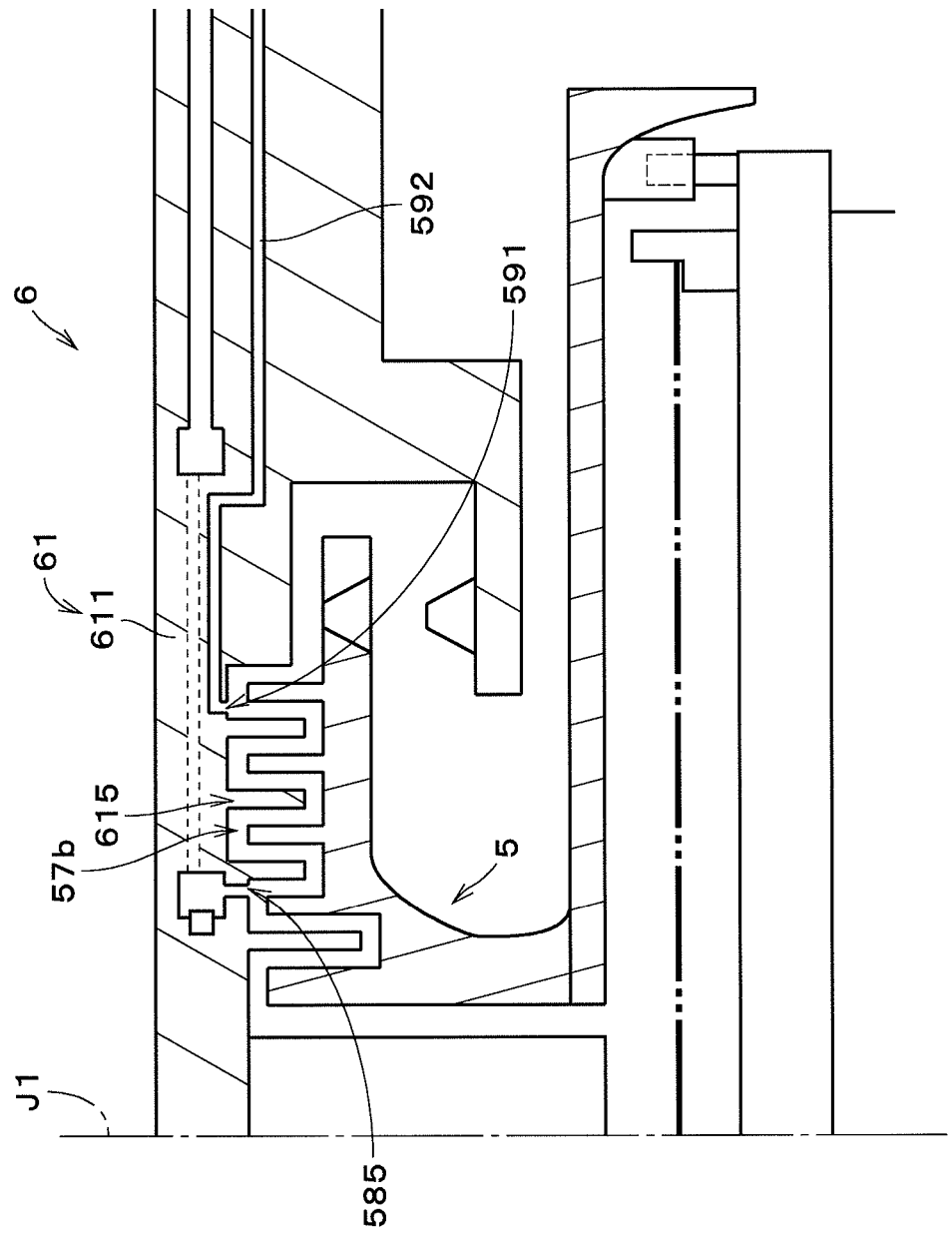

SUBSTRATE PROCESSING APPARATUS AND SUBSTRATE PROCESSING METHOD

CROSS-REFERENCE TO RELATED APPLICATIONS

The present application is a 35 U.S.C. §§ 371 national phase conversion of PCT/JP2016/088671, filed Dec. 26, 2016, which claims priority to Japanese Patent Application No. 2016-022449, filed Feb. 9, 2016, the contents of both of which are incorporated herein by reference. The PCT International Application was published in the Japanese language.

TECHNICAL FIELD

The present invention relates to a technique for processing a substrate.

BACKGROUND ART

A process of manufacturing a semiconductor substrate (hereinafter, simply referred to as a "substrate") conventionally involves various types of processing that is performed on the substrate. For example, a chemical solution is supplied to a substrate having a resist pattern on its surface so that chemical solution processing such as etching is performed on the surface of the substrate. After completion of the chemical solution processing, cleaning processing is performed by supplying a cleaning liquid to the substrate, and thereafter dry processing is performed on the substrate.

The substrate processing apparatus disclosed in Japanese Patent Application Laid-Open No. 2003-100694 (Document 1) includes a spin chunk that horizontally holds and rotates a substrate, and a disk-shaped shielding plate that is disposed above and facing a substrate. The spin chunk is fixed to the upper end of a rotary shaft of a chuck rotation driving mechanism. The upper surface of the shielding plate is fixed to another rotary shaft extending along an axis line that is common to the rotary shaft of the spin chunk. The other rotary shaft has a hollow shape, and a processing liquid nozzle for supplying a processing liquid to the upper surface of a substrate is inserted through this rotary shaft. Also, a nitrogen gas passage that distributes a nitrogen gas for drying substrates is present between the inner side face of the other rotary shaft and the outer side face of the processing liquid nozzle.

In the substrate processing apparatus of Document 1, the shielding plate is rotated at approximately the same speed and in approximately the same direction as a substrate during dry processing performed on the substrate. Also, a nitrogen gas is supplied from the aforementioned nitrogen gas passage to the space between the substrate and the shielding plate. This generates a stable stream of nitrogen gas between the substrate and the shielding plate, and the atmosphere between the substrate and the shielding plate is continuously replaced by this stream. As a result, the substrate is dried quickly, and re-fouling of the substrate caused by splashes of the processing liquid shaken off the substrate is prevented.

Incidentally, in such a substrate processing apparatus, the lower surface of the shielding plate may become electrostatically charged by friction between the lower surface of the shielding plate and the stream of nitrogen gas. If the lower surface of the shielding plate becomes charged, there is a possibility that particles in the atmosphere may be adsorbed to the lower surface of the shielding plate, and the adsorbed particles may drop on a substrate that has undergone dry processing and thereby foul the substrate that has undergone dry processing. There is also a possibility that discharges between the shielding plate and the substrate may cause damage to wiring on the substrate. Moreover, for example, the use of combustible chemical solutions as processing liquids may be restricted during the processing of substrates.

In view of this, the substrate processing apparatus of Document 1 dissipates charges from the lower surface of the shielding plate by applying feeble X rays, which are electromagnetic waves having the property of dissipating charges, toward the lower surface of the shielding plate that has undergone dry processing. The application of feeble X rays to the shielding plate may be carried out while a splash guard is retracted downward in a state in which the shielding plate is positioned in close proximity to a substrate before dry processing.

The substrate processing apparatus of Patent Document 1, however, requires a mechanism for applying X rays to the shielding plate, and therefore the structure of the apparatus may become complicated and increase in size. There is also a possibility that the processing nozzle may become charged by friction with the nitrogen gas flowing through the nitrogen gas passage between the rotary shaft of the shielding plate and the processing nozzle, and the processing liquid or other substances may adhere to the processing nozzle. Since the processing nozzle is housed inside the rotary shaft of the shielding plate, it is not easy to dissipate charges thereon by the application of X rays.

SUMMARY OF INVENTION

The present invention is intended for a substrate processing apparatus for processing a substrate, and it is an object of the present invention to dissipate charges from an opposing member with a simple structure. The present invention is also intended for a substrate processing method of processing a substrate.

A substrate processing apparatus according to the present invention includes a substrate holder that holds a substrate in a horizontal position, a substrate rotation mechanism that rotates the substrate holder about a central axis pointing in an up-down direction, an opposing member that opposes an upper surface of the substrate and rotates about the central axis, a processing liquid supply part that supplies a processing liquid to the upper surface of the substrate, a gas supply part that supplies a treatment atmospheric gas to a radial central part of a lower space that is a space below the opposing member, an ion generator that generates and supplies ions to the treatment atmospheric gas supplied from the gas supply part, and a controller that controls the substrate rotation mechanism, the gas supply part, and the ion generator to, in a state in which the opposing member is positioned lower than when the substrate is transported into the apparatus, supply the treatment atmospheric gas that contains the ions to the lower space and form an ion stream that spreads radially outward from the radial central part of the lower space while rotating the substrate holder and the opposing member. Thus, it is possible to dissipate charges from the opposing member with a simple structure.

According to a preferable embodiment of the present invention, the lower space where the ion stream is formed is a processing space that is a space between a lower surface of the opposing member and the upper surface of the substrate, and the formation of the ion stream is carried out at a time of dry processing for removing the processing liquid supplied from the processing liquid supply part from above the substrate by rotation of the substrate via the substrate rotation mechanism.

According to another preferable embodiment of the present invention, the lower space where the ion stream is formed is a processing space that is a space between a lower surface of the opposing member and the upper surface of the substrate, and the formation of the ion stream is carried out before processing of the substrate with the processing liquid supplied from the processing liquid supply part.

More preferably, the formation of the ion stream before processing of the substrate with the processing liquid is carried out using the treatment atmospheric gas that is supplied at a time of processing of the substrate with the processing liquid.

According to another preferable embodiment of the present invention, the substrate processing apparatus further includes an opposing-member moving mechanism that holds the opposing member and moves the opposing member relative to the substrate holder between a first position and a second position in the up-down direction. The opposing member, when positioned at the first position, is held by the opposing-member moving mechanism and spaced above from the substrate holder, and the opposing member, when positioned at the second position, is held by the substrate holder and rotated together with the substrate holder by the substrate rotation mechanism.

More preferably, the opposing member includes an opposing-member main body that opposes the upper surface of the substrate and has an opposing member opening in a radial central portion thereof, and an opposing-member cylindrical part that protrudes upward from a periphery of the opposing member opening of the opposing-member main body. The processing liquid supply part includes a processing liquid nozzle that is inserted in the opposing-member cylindrical part and supplies the processing liquid to the upper surface of the substrate through the opposing member opening, and the treatment atmospheric gas that contains the ions is supplied to the lower space through a nozzle gap that is a space between the processing liquid nozzle and the opposing-member cylindrical part.

Yet more preferably, the opposing member further includes an opposing-member flange part that annularly extends radially outward from an upper end of the opposing-member cylindrical part and that is held by the opposing-member moving mechanism. In a state in which the opposing member is positioned at the second position, a labyrinth that communicates with the nozzle gap is formed above an upper surface of the opposing-member flange part. The nozzle gap is sealed against an external space by supplying the treatment atmospheric gas that contains the ions to the labyrinth, and the treatment atmospheric gas that contains the ions and that flows out of the labyrinth forms an upper ion stream that spreads radially outward from the radial central portion along an upper surface of the opposing member.

More preferably, the ion generator includes a discharge needle that generates ions by discharge. The opposing member further includes a first uneven part in which a recessed portion and a raised portion are alternately disposed concentrically on the upper surface of the opposing-member flange part. The opposing-member moving mechanism includes a holder lower part that opposes a lower surface of the opposing-member flange part in the up-down direction, a holder upper part that opposes the upper surface of the opposing-member flange part in the up-down direction, and a second uneven part in which a recessed portion and a raised portion are alternately disposed concentrically on a lower surface of the holder upper part. In a state in which the opposing member is positioned at the second position, the labyrinth is formed by disposing the raised portion of one of the first uneven part and the second uneven part within the recessed portion of the other of the first uneven part and the second uneven part with a gap therebetween. Within the holder upper part, the discharge needle is disposed inside a jet opening through which the treatment atmospheric gas is jet and that is formed in an upper surface of the recessed portion of the second uneven part.

These and other objects, features, aspects and advantages of the present invention will become more apparent from the following detailed description of the present invention when taken in conjunction with the accompanying drawings.

BRIEF DESCRIPTION OF DRAWINGS

FIG. 9 is a sectional view showing an example of another labyrinth; and

FIG. 10 is a sectional view showing an example of another labyrinth.

DESCRIPTION OF EMBODIMENTS

Figure 1:
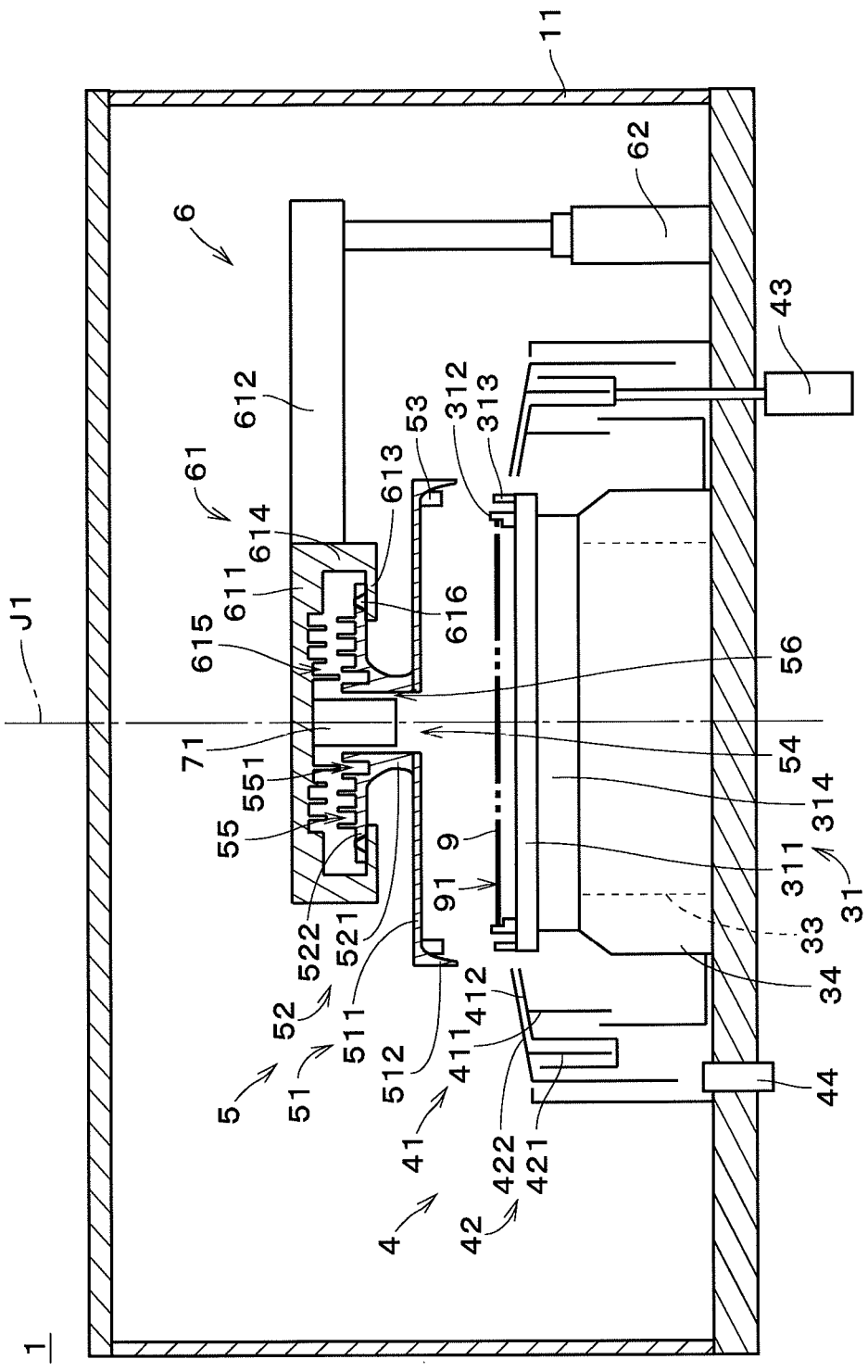
FIG. 1 is a sectional view of a substrate processing apparatus according to an embodiment.

FIG. 1 is a sectional view of a configuration of a substrate processing apparatus 1 according to an embodiment of the present invention. The substrate processing apparatus 1 is a single wafer processing apparatus for processing semiconductor substrates 9 (hereinafter, simply referred to as "substrates 9") one at a time. The substrate processing apparatus 1 includes a substrate holder 31, a substrate rotation mechanism 33, a cup part 4, a top plate 5, an opposing-member moving mechanism 6, and a processing liquid nozzle 71. The constituent elements of the substrate processing apparatus 1 are housed inside a housing 11.

The substrate holder 31 holds a substrate 9 in a horizontal position. The substrate holder 31 includes a holder base 311, a plurality of chucks 312, a plurality of engagement parts 313, and a base supporter 314. The substrate 9 is disposed above and spaced from the holder base 311. The holder base 311 and the base supporter 314 are each a generally disk-like member about a central axis J1 pointing in the up-down direction. The holding base part 311 is disposed above the base supporter 314 and supported from below by the base supporter 314. The outer diameter of the substrate holder 31 is larger than the outer diameter of the base supporter 314. The holder base 311 extends radially outward of the base supporter 314 along the entire circumference thereof about the central axis J1.

The plurality of chucks 312 are circumferentially arranged at approximately equiangular intervals about the central axis J1 on the outer peripheral portion of the upper surface of the holder base 311. In the substrate holder 31, the outer edge of the substrate 9 is supported by the plurality of chucks 312. The plurality of engagement parts 313 are circumferentially arranged at approximately equiangular intervals about the central axis J1 on the outer peripheral portion of the upper surface of the holder base 311. The plurality of engagement parts 313 are disposed radially outward of the plurality of chucks 312.

The substrate rotation mechanism 33 is housed inside a rotation-mechanism housing part 34. The substrate rotation mechanism 33 and the rotation-mechanism housing part 34 are disposed below the substrate holder 31. The substrate rotation mechanism 33 rotates the substrate holder 31 about the central axis J1. Accordingly, the substrate 9 is rotated together with the substrate holder 31.

The cup part 4 is a ring-shaped member about the central axis J1 and disposed radially outward of the substrate 9 and the substrate holder 31. The cup part 4 is disposed around the entire circumferences of the substrate 9 and the substrate holder 31 and receives processing liquids or the like dispersed from the substrate 9 toward the surroundings. The cup part 4 includes a first guard 41, a second guard 42, a guard moving mechanism 43, and a discharge port 44.

The first guard 41 has a first-guard side wall part 411 and a first-guard canopy part 412. The first-guard side wall part 411 has a generally cylindrical shape about the central axis J1. The first-guard canopy part 412 has a generally circular ring plate-like shape about the central axis J1 and extends radially inward from the upper end of the first-guard side wall part 411. The second guard 42 has a second-guard side wall part 421 and a second-guard canopy part 422. The second-guard side wall part 421 has a generally cylindrical shape about the central axis J1 and is located radially outward of the first-guard side wall part 411. The second-guard canopy part 422 has a generally circular ring plate-like shape about the central axis J1 and extends radially inward from the upper end of the second-guard side wall part 421 above the first-guard canopy part 412. The inner diameter of the first-guard canopy part 412 and the inner diameter of the second-guard canopy part 422 are slightly larger than the outer diameter of the holding base part 311 of the substrate holder 31 and the outer diameter of the top plate 5.

The guard moving mechanism 43 switches a guard that receives processing liquids or the like from the substrate 9 between the first guard 41 and the second guard 42 by moving the first guard 41 in the up-down direction. The processing liquids or the like received by the first guard 41 and the second guard 42 of the cup part 4 are discharged through the discharge port 44 to the outside of the housing 11. Gases in the first guard 41 and in the second guard 42 are also exhausted through the discharge port 44 to the outside of the housing 11.

The top plate 5 is a generally circular member in plan view. The top plate 5 is an opposing member that opposes an upper surface 91 of the substrate 9 and serves as a shield plate that shields the top of the substrate 9. The outer diameter of the top plate 5 is larger than the outer diameter of the substrate 9 and the outer diameter of the holding base part 311. The top plate 5 includes an opposing-member main body 51, a held part 52, a plurality of engagement parts 53, and a first uneven part 55. The opposing-member main body 51 includes an opposing-member canopy part 511 and an opposing-member side wall part 512. The opposing-member canopy part 511 is a generally circular ring plate-like member about the central axis J1 and opposes the upper surface 91 of the substrate 9. The top plate 5 is made of, for example, a nonconductive resin. The material for the top plate 5 is preferably a material that substantially does not contain conductive materials such as carbon in order to prevent the material from having an unintentional influence on the processing of the substrate 9.

The opposing-member canopy part 511 has an opposing member opening 54 in its central portion. The opposing member opening 54 is, for example, approximately circular in plan view. The diameter of the opposing member opening 54 is sufficiently smaller than the diameter of the substrate 9. The opposing-member side wall part 512 is a generally cylindrical member about the central axis J1 and extends downward from the outer periphery of the opposing-member canopy part 511.

The plurality of engagement parts 53 are circumferentially arranged at approximately equiangular intervals about the central axis J1 on the outer peripheral portion of the lower surface of the opposing-member canopy part 511. The plurality of engagement parts 53 are disposed on the radially inner side of the opposing-member side wall part 512.

The held part 52 is connected to the upper surface of the opposing-member main body 51. The held part 52 includes an opposing-member cylindrical part 521 and an opposing-member flange part 522. The opposing-member cylindrical part 521 is a generally tubular part that protrudes upward from the periphery of the opposing member opening 54 of the opposing-member main body 51. The opposing-member cylindrical part 521 has, for example, a generally cylindrical shape about the central axis J1. The opposing-member flange part 522 annularly extends radially outward from the upper end of the opposing-member cylindrical part 521. The opposing-member flange part 522 has, for example, a generally circular ring plate-like shape about the central axis J1. The first uneven part 55 in which circumferential recessed portions and circumferential raised portions are alternately disposed concentrically is provided on the upper surface of the opposing-member flange part 522. The first uneven part 55 includes a plurality of recessed portions and a plurality of raised portions. A radially innermost recessed portion 551 among the plurality of recessed portions is provided in an upper portion of the opposing-member tubular part 521 and has a larger dimension in the up-down direction than the other recessed portions of the first uneven part 55.

The opposing-member moving mechanism 6 includes an opposing member holder 61 and an opposing member elevating mechanism 62. The opposing member holder 61 holds the held part 52 of the top plate 5. The opposing member holder 61 includes a holder body 611, a body supporter 612, a flange supporter 613, a supporter connector 614, and a second uneven part 615. The holder body 611 has, for example, a generally disk-like shape about the central axis J1. The holder body 611 covers the top of the opposing-member flange part 522 of the top plate 5. The body supporter 612 is a rod-like arm that extends generally horizontally. One end of the body supporter 612 is connected to the holder body 611, and the other end thereof is connected to the opposing-member elevating mechanism 62.

The processing liquid nozzle 71 protrudes downward from the central portion of the holder body 611. The processing liquid nozzle 71 is inserted in the opposing-member tubular part 521 in a non-contact state. In the following description, the space between the processing liquid nozzle 71 and the opposing-member tubular part 521 is referred to as a "nozzle gap 56." The nozzle gap 56 is, for example, a generally cylindrical space about the central axis J1. The second uneven part 615 in which circumferential recessed portions and circumferential raised portions are alternately disposed concentrically on the lower surface of the holder body 611 is provided around the processing liquid nozzle 71. The second uneven part 615 opposes the first uneven part 55 in the up-down direction.

The flange supporter 613 has, for example, a generally circular ring plate-like shape about the central axis J1. The flange supporter 613 is located below the opposing-member flange part 522. The inner diameter of the flange supporter 613 is smaller than the outer diameter of the opposing-member flange part 522 of the top plate 5. The outer diameter of the flange supporter 613 is larger than the outer diameter of the opposing-member flange part 522 of the top plate 5. The supporter connector 614 has, for example, a generally cylindrical shape about the central axis J1. The supporter connector 614 connects the flange supporter 613 and the holder body 611 around the opposing-member flange part 522. In the opposing member holder 61, the holder body 611 is a holder upper part that opposes the upper surface of the opposing-member flange part 522 in the up-down direction, and the flange supporter 613 is a holder lower part that opposes the lower surface of the opposing-member flange part 522 in the up-down direction.

In a state in which the top plate 5 is positioned at the position illustrated in FIG. 1, the flange supporter 613 comes in contact with and supports the outer peripheral portion of the opposing-member flange part 522 of the top plate 5 from below. In other words, the opposing-member flange part 522 is held by the opposing member holder 61 of the opposing-member moving mechanism 6. Thus, the top plate 5 is suspended from the opposing member holder 61 above the substrate 9 and the substrate holder 31. In the following description, the position of the top plate 5 in the up-down direction in FIG. 1 is referred to as a "first position." When positioned at the first position, the top plate 5 is held by the opposing-member moving mechanism 6 and spaced above from the substrate holder 31. Also, in the state in which the top plate 5 is positioned at the first position, the lower ends of the raised portions of the second uneven part 615 are positioned above the upper ends of the raised portions of the first uneven part 55.

The flange supporter 613 is provided with a movement restricting part 616 for restricting a positional shift of the top plate 5 (i.e., movement and rotation of the top plate 5). In the example illustrated in FIG. 1, the movement restricting part 616 is a protruding part that protrudes upward from the upper surface of the flange supporter 613. The positional shift of the top plate 5 is restricted when the movement restricting part 616 is inserted in a hole formed in the opposing-member flange part 522.

Figure 2:
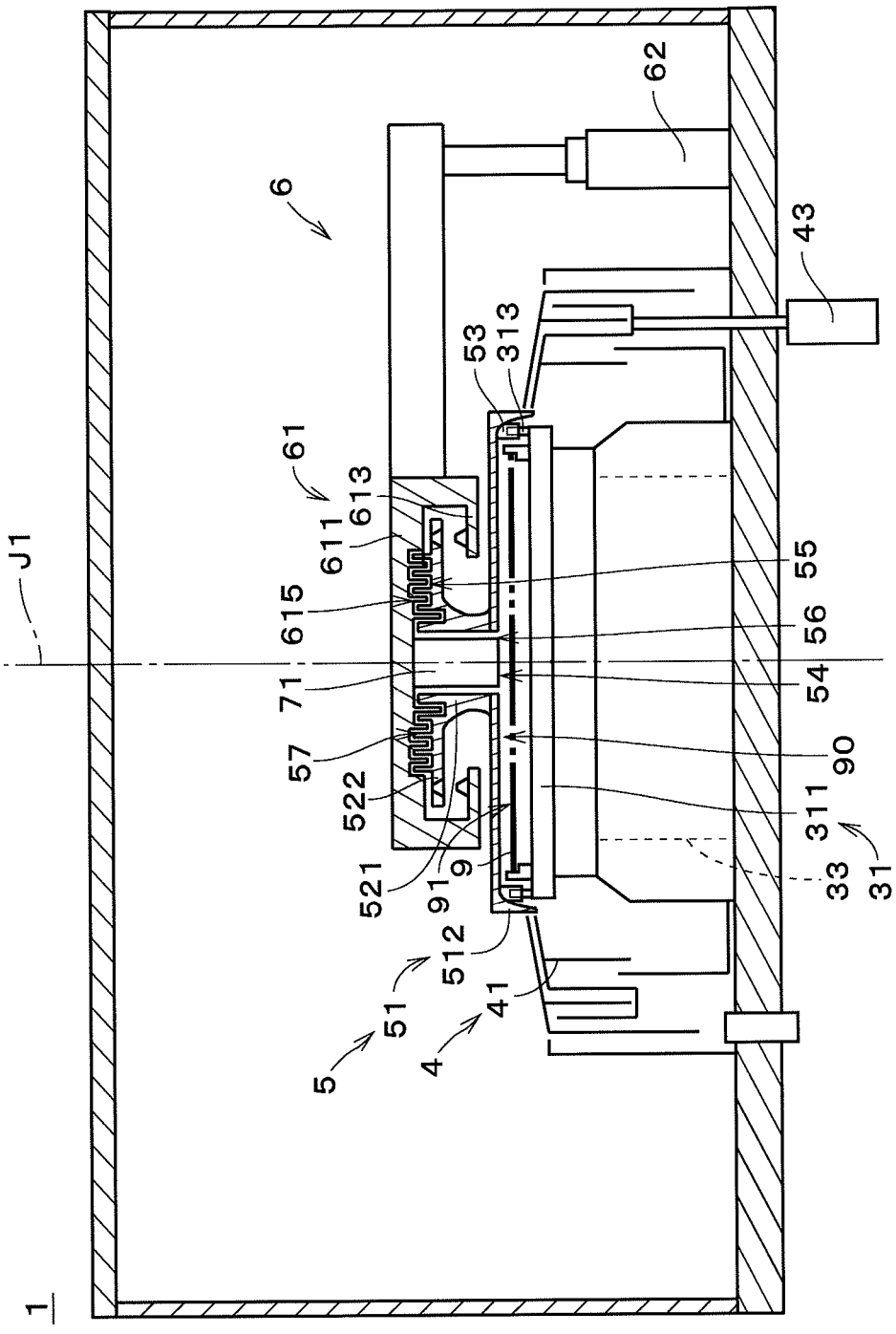
FIG. 2 is a sectional view of the substrate processing apparatus.

The opposing-member elevating mechanism 62 moves the top plate 5 along with the opposing member holder 61 in the up-down direction. FIG. 2 is a sectional view illustrating a state in which the top plate 5 has been moved down from the first position illustrated in FIG. 1. In the following description, the position of the top plate 5 in the up-down direction in FIG. 2 is referred to as a "second position." That is, the opposing-member elevating mechanism 62 moves the top plate 5 relative to the substrate holder 31 in the up-down direction between the first position and the second position. The second position is a position lower than the first position. In other words, the second position is a position at which the top plate 5 comes closer to the substrate holder 31 in the up-down direction than at the first position.

In the state in which the top plate 5 is positioned at the second position, the plurality of engagement parts 53 of the top plate 5 are respectively engaged with the plurality of engagement parts 313 of the substrate holder 31. The plurality of engagement parts 53 are supported from below by the plurality of engagement parts 313. In other words, the plurality of engagement parts 313 are opposing-member supporters that support the top plate 5. For example, the engagement parts 313 are pins that extend in generally parallel with the up-down direction, and the upper ends of the engagement parts 313 fit into upwardly opening recesses formed in the lower ends of the engagement parts 53. Also, the opposing-member flange part 522 of the top plate 5 is spaced above from the flange supporter 613 of the opposing member holder 61. Thus, when positioned at the second position, the top plate 5 is held by the substrate holder 31 and spaced from the opposing-member moving mechanism 6 (i.e., not in contact with the opposing-member moving mechanism 6).

In the state in which the top plate 5 is held by the substrate holder 31, the lower end of the opposing-member side wall part 512 of the top plate 5 is, for example, positioned below the upper surface of the holding base part 311 of the substrate holder 31 or at the same position in the up-down direction as the upper surface of the holding base part 311. When the substrate rotation mechanism 33 is driven in the state in which the top plate 5 is positioned at the second position, the top plate 5 rotates about the central axis J1 along with the substrate 9 and the substrate holder 31. In other words, in the state in which the top plate 5 is positioned at the second position, the top plate 5 is rotatable about the central axis J1 along with the substrate 9 and the substrate holder 31 by the substrate rotation mechanism 33.

As described above, the processing liquid nozzle 71 is not in contact with the opposing-member cylindrical part 521 while having the nozzle gap 56 in between, and is located radially inward of the opposing-member cylindrical part 521 without being rotated during the rotation of the top plate 5. In other words, when the top plate 5 is rotated, the opposing-member cylindrical part 521 rotates along with the other parts of the top plate 5 around the processing liquid nozzle 71 that remains at rest.

Figure 3:
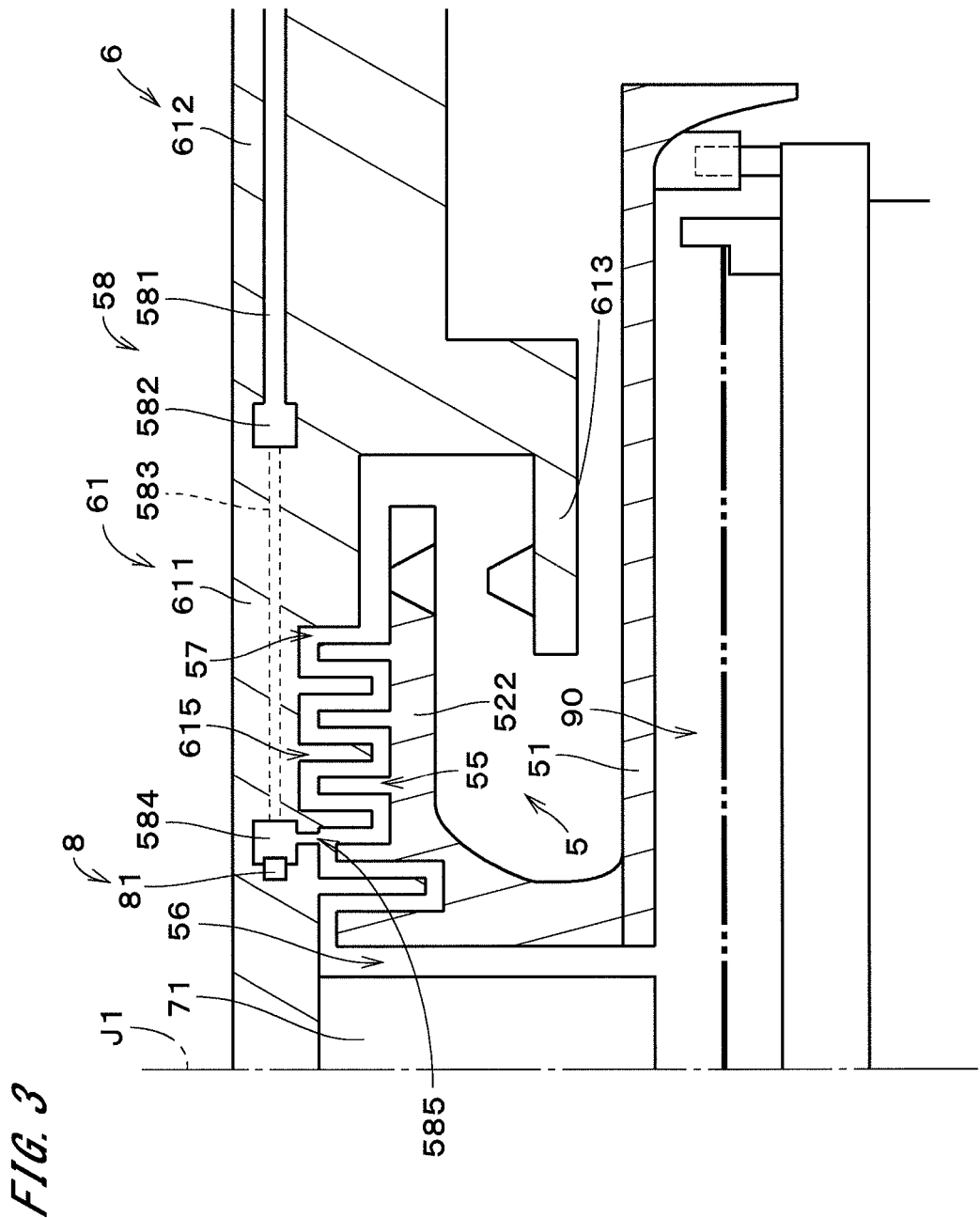
FIG. 3 is an enlarged sectional view of part of a top plate and an opposing-member moving mechanism.

FIG. 3 is an enlarged sectional view of part of the top plate 5 and the opposing-member moving mechanism 6. As illustrated in FIGS. 2 and 3, in the state in which the top plate 5 is positioned at the second position, the first uneven part 55 and the second uneven part 615 are in close proximity to each other in the up-down direction in a non-contact state. The raised portions of the first uneven part 55 are disposed inside the recessed portions of the second uneven part 615 with a gap therebetween, and the raised portions of the second uneven part 615 are disposed inside the recessed portions of the first uneven part 55 with a gap therebetween. In other words, the raised portions of one of the first uneven part 55 and the second uneven part 615 are disposed inside the recessed portions of the other of the first uneven part 55 and the second uneven part 615 with a gap therebetween. Accordingly, a labyrinth 57 is formed on the upper surface of the opposing-member flange part 522. Specifically, the labyrinth 57 is formed around the processing liquid nozzle 71 between the opposing-member flange part 522 of the top plate 5 and the holder body 611 of the opposing-member moving mechanism 6. The distance in the up-down direction between the first uneven part 55 and the second uneven part 615 and the distance in the radial direction therebetween are approximately constant throughout the labyrinth 57. The labyrinth 57 communicates with the nozzle gap 56. When the top plate 5 is rotated, the first uneven part 55 rotates, whereas the second uneven part 615 does not rotate.

Figure 4:
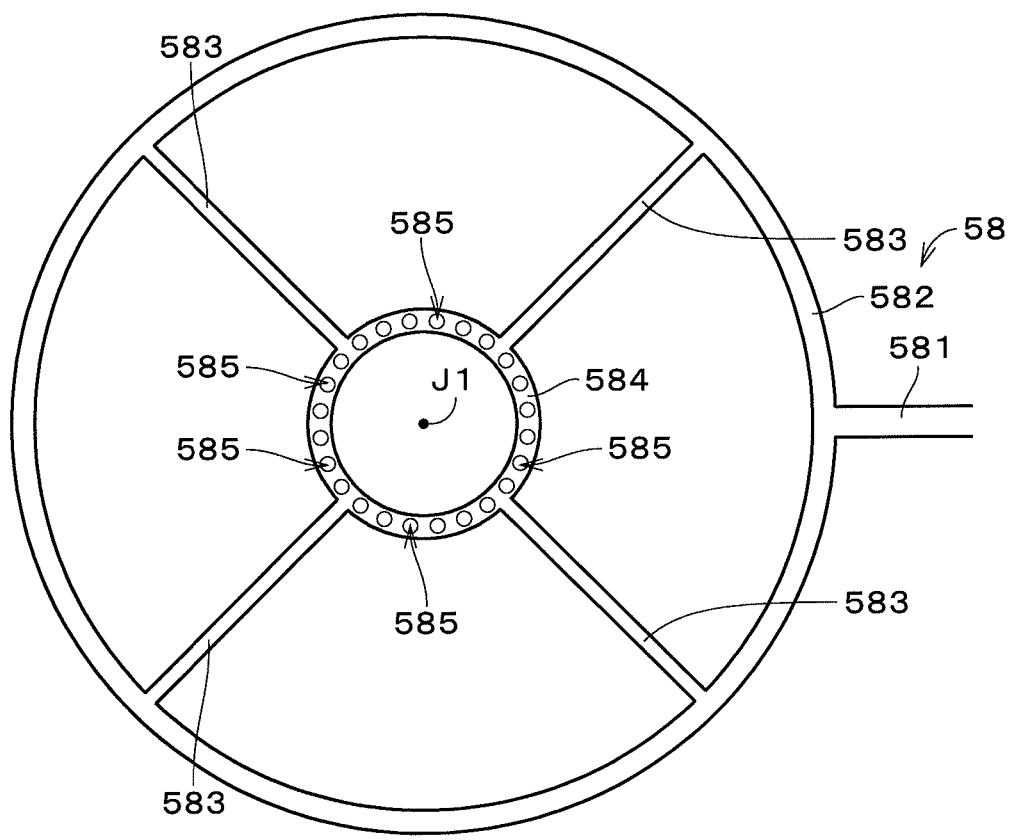
FIG. 4 is a plan view of a gas supply passage.

As illustrated in FIG. 3, a gas supply passage 58 that is connected to the labyrinth 57 is provided inside the opposing member holder 61. Note that the gas supply passage 58 is not shown in FIGS. 1 and 2 described above. FIG. 4 is a plan view of the gas supply passage 58. As illustrated in FIGS. 3 and 4, the gas supply passage 58 includes a first passage 581, a first manifold 582, a plurality of second passages 583, a second manifold 584, and a plurality of gas jet openings 585. The first manifold 582, the plurality of second passages 583, and the second manifold 584 are formed inside the holder body 611, and the plurality of gas jet openings 585 are formed in the lower surface of the holder body 611. Specifically, the plurality of gas jet openings 585 are formed in the upper surface of one recessed portion of the second uneven part 615 of the holder body 611. Also, the first passage 581 is formed inside the body supporter 612.

The plurality of gas jet openings 585 are circumferentially arranged at generally equiangular intervals in the upper surface of one recessed portion (i.e., bottom surface of the recessed portion) of the second uneven part 615. The plurality of gas jet openings 585 are peripheral jet openings that are disposed circumferentially about the central axis J1. The peripheral jet openings are disposed between the radially inner and outer ends of the labyrinth 57. The gas supply passage 58 may be provided with, for example, one generally circular ring-shaped jet opening about the central axis J1 as a peripheral jet opening, instead of the plurality of gas jet openings 585.

The second manifold 584 is disposed above the plurality of gas jet openings 585 and connected to the plurality of gas jet openings 585. The second manifold 584 is a generally circuit ring-shaped passage about the central axis J1. The first manifold 582 is disposed radially outward of the second manifold 584. The first manifold 582 is a generally circular ring-shaped passage about the central axis J1. The plurality of second passages 583 are linear passages that extend generally in the radial direction and connect the first manifold 582 and the second manifold 584. In the example illustrated in FIG. 4, four second passages 583 are circumferentially arranged at generally equiangular intervals. The first passage 581 extends radially outward from the first manifold 582. The first passage 581 is disposed at a different position in the circumferential direction from the positions of the plurality of second passages 583.

Figure 5:
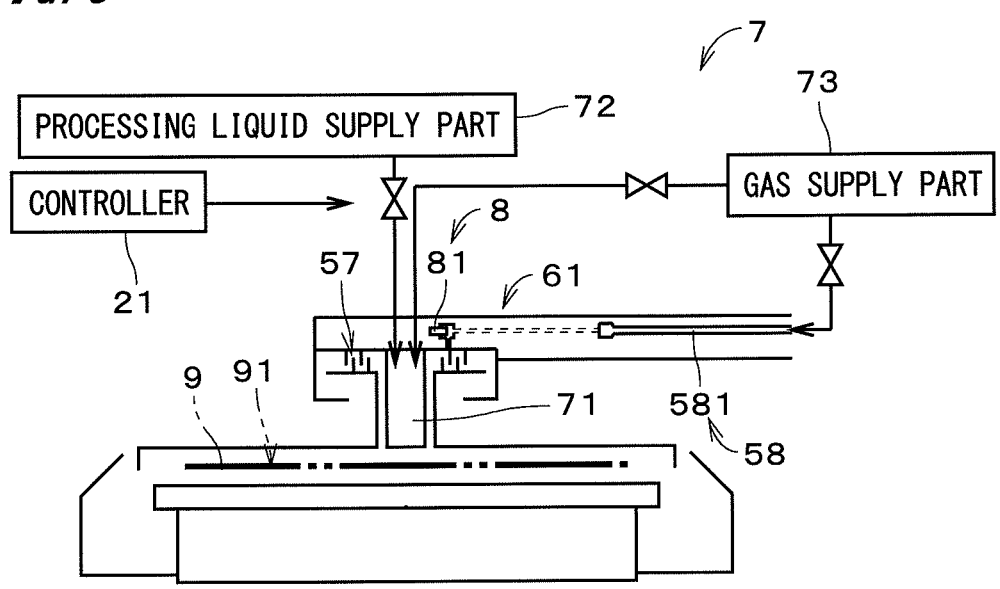
FIG. 5 is a block diagram of a gas-liquid supply part.

FIG. 5 is a block diagram of a gas-liquid supply part 7 that relates to the supply of gases and processing liquids in the substrate processing apparatus 1. The gas-liquid supply part 7 includes the processing liquid nozzle 71, a processing liquid supply part 72, and a gas supply part 73. The processing liquid supply part 72 is connected to the processing liquid nozzle 71. The gas supply part 73 is connected to the processing liquid nozzle 71 and supplies gases to the processing liquid nozzle 71. The gas supply part 73 is also connected to the first passage 581 of the gas supply passage 58 provided in the opposing member holder 61 and supplies gases through the gas supply passage 58 to the labyrinth 57.

The substrate processing apparatus 1 further includes a controller 21. The controller 21 controls constituent elements such as the substrate rotation mechanism 33 and the opposing-member moving mechanism 6 (see FIG. 1), the processing liquid supply part 72, the gas supply part 73, and an ion generator 8, which will be described later. Note that the controller 21 is not shown in the drawings other than FIG. 5, in order to simplify the drawings.

The substrate processing apparatus 1 uses various types of liquids as processing liquids. The processing liquids may, for example, be chemical solutions (e.g., a polymer removing solution or an etchant such as hydrofluoric acid or an aqueous solution of tetra methyl ammonium hydroxide) for use in chemical solution processing of the substrate 9. The processing liquids may, for example, be cleaning liquids such as deionized water (DIW) or carbonated water for use in the cleaning processing of the substrate 9. The processing liquids may, for example, be isopropyl alcohol (IPA) that is supplied to replace a liquid on the substrate 9. The gases supplied from the gas supply part 73 are, for example, inert gases such as a nitrogen ($N_2$) gas. Alternatively, the gas supply part 73 may supply various gases other than inert gases.

Figure 6:
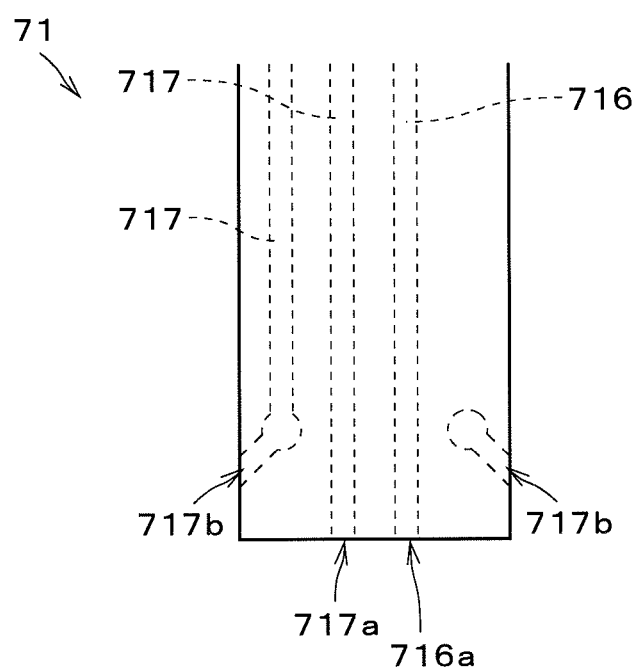
FIG. 6 is an enlarged sectional view of part of a processing liquid nozzle.

FIG. 6 is an enlarged sectional view of part of the processing liquid nozzle 71. The processing liquid nozzle 71 is formed of, for example, PFA (tetrafluoroethylene-perfluoroalkylvinylether copolymer). The processing liquid nozzle 71 includes a processing liquid passage 716 and two gas passages 717. The processing liquid passage 716 is connected to the processing liquid supply part 72 illustrated in FIG. 5. The two gas passages 717 are connected to the gas supply part 73 illustrated in FIG. 5.

A processing liquid that is supplied from the processing liquid supply part 72 to the processing liquid passage 716 illustrated in FIG. 6 is ejected downward from an ejection port 716a that is provided in the lower end surface of the processing liquid nozzle 71. In the case where a plurality of types of processing liquids are ejected from the processing liquid nozzle 71, the processing liquid nozzle 71 may include a plurality of processing liquid passages 716 that correspond respectively to the plurality of types of processing liquids, and the plurality of types of processing liquids may be ejected respectively from a plurality of ejection ports 716a.

An inert gas that is supplied from the gas supply part 73 to the central gas passage 717 (the gas passage 717 on the right side in FIG. 6) is supplied (e.g., jetted) downward from a lower-surface jet opening 717a that is provided in the lower end surface of the processing liquid nozzle 71. An inert gas that is supplied from the gas supply part 73 to the outer peripheral gas passage 717 is supplied to the surroundings from a plurality of side-surface jet openings 717b that are provided in the side surface of the processing liquid nozzle 71.

The plurality of side-surface jet openings 717b are arrayed at approximately equiangular intervals in the circumferential direction. The plurality of side-surface jet openings 717b are connected to a peripheral passage that extends in the circumferential direction from the lower end of the outer peripheral gas passage 717. The inert gas supplied from the gas supply part 73 is supplied (e.g., jetted) diagonally downward from the plurality of side-surface jet openings 717b. Note that there may be only one side-surface jet opening 717b.

The processing liquid supplied from the processing liquid supply part 72 (see FIG. 5) is ejected from the ejection port 716a of the processing liquid nozzle 71 through the opposing member opening 54 illustrated in FIG. 2 toward the upper surface 91 of the substrate 9. In other words, the processing liquid nozzle 71 supplies the processing liquid supplied from the processing liquid supply part 72 to the upper surface 91 of the substrate 9 through the opposing member opening 54. In the substrate processing apparatus 1, the processing liquid nozzle 71 may protrude downward from the opposing member opening 54 of the opposing-member body 51. In other words, the tip end of the processing liquid nozzle 71 may be located below the lower end of the opposing member opening 54. The processing liquid supplied from the processing liquid supply part 72 flows down through the opposing member opening 54 in the processing liquid nozzle 71 and is ejected from the ejection port 716a (see FIG. 6) of the processing liquid nozzle 71 toward the upper surface 91 of the substrate 9. Supplying the processing liquid through the opposing member opening 54 includes not only a state in which the processing liquid that is ejected from the processing liquid nozzle 71 above the opposing member opening 54 passes through the opposing member opening 54, but also a state in which the processing liquid is ejected through the processing liquid nozzle 71 inserted in the opposing member opening 54.

Part of the inert gas supplied from the gas supply part 73 (see FIG. 5) to the processing liquid nozzle 71 is supplied from the lower-surface jet opening 717a (see FIG. 6) of the processing liquid nozzle 71 to the radial central part of a lower space that is the space below the top plate 5. To be specific, part of the inert gas supplied from the gas supply part 73 is supplied from the lower-surface jet opening 717a of the processing liquid nozzle 71 through the opposing member opening 54 to the radial central part of a processing space 90 that is the space between the lower surface of the top plate 5 and the upper surface 91 of the substrate 9. Part of the inert gas supplied from the gas supply part 73 to the processing liquid nozzle 71 is supplied from the plurality of side-surface jet openings 717b (see FIG. 6) of the processing liquid nozzle 71 to the nozzle gap 56. In the nozzle gap 56, the inert gas from the gas supply part 73 is supplied diagonally downward from the side surface of the processing liquid nozzle 71, flows downward, and is supplied to the processing space 90.

The substrate processing apparatus 1 processes the substrate 9 preferably in a state in which an inert gas atmosphere is created in the processing space 90 by the supply of an inert gas from the processing liquid nozzle 71 to the processing space 90. In other words, the gas supplied from the gas supply part 73 to the processing space 90 is a treatment atmospheric gas. The treatment atmospheric gas also includes a gas that is supplied from the processing liquid nozzle 71 to the nozzle gap 56 and supplied through the nozzle gap 56 to the aforementioned lower space (i.e., processing space 90).

The inert gas supplied from the gas supply part 73 to the first passage 581 of the gas supply passage 58 illustrated in FIGS. 3 and 4 spreads in the circumferential direction in the first manifold 582 and is guided through the plurality of second passages 583 to the second manifold 584. The inert gas also spreads in the circumferential direction in the second manifold 584 and is jetted from the plurality of gas jet openings 585 toward the lower labyrinth 57 between the radially inner and outer ends of the labyrinth 57. Though this supply of the inert gas from the plurality of gas jet openings 585 to the labyrinth 57, the nozzle gap 56, which is the space on the radially inner side of the labyrinth 57, and the processing space 90, which communicates with the nozzle gap 56, are sealed against the space on the radially outer side of the labyrinth 57. That is, the gas supplied from the gas supply part 73 to the labyrinth 57 serves as a seal gas. The inert gas supplied from the plurality of gas jet openings 585 to the labyrinth 57 spreads radially outward and radially inward in the labyrinth 57.

The inert gas that spreads radially inward in the labyrinth 57 is supplied from the labyrinth 57 to the nozzle gap 56 and supplied through the nozzle gap 56 to the aforementioned lower space (i.e., processing space 90). The inert gas that spreads radially outward in the labyrinth 57 passes through the labyrinth 57, flows around to below the opposing-member flange part 522, and is supplied from the space between the opposing-member flange part 522 and the flange supporter 613 to the upper surface of the top plate 5 (i.e., upper surface of the opposing-member main body 51).

In the example illustrated in FIG. 5, the gas supply part 73 serves as a seal gas supply part that is a supply source of the seal gas, and also serves as a treatment atmospheric gas supply part that is a supply source of the treatment atmospheric gas. Also, the gas jet openings 585 illustrated in FIG. 3 serve as jet openings for the seal gas and also serve as jet openings for the treatment atmospheric gas. The treatment atmospheric gas and the seal gas are the same type of gas. Note that the treatment atmospheric gas and the seal gas may be different types of gas. In the gas supply passage 58, the first manifold 582 and the second manifold 584 are each a ring-shaped manifold that temporarily stores the seal gas between the gas supply part 73 serving as a seal gas supply part and the plurality of gas jet openings 585.

As illustrated in FIGS. 3 and 5, the substrate processing apparatus 1 further includes the ion generator 8. The ion generator 8 generates ions and supplies the ions to the inert gas supplied from the gas supply part 73. The ion generator 8 includes a discharge needle 81 that generates ions by discharge. The discharge needle 81 is disposed, for example, inside the holder body 611. Preferably, the discharge needle 81 is disposed inside the gas jet openings 585 and in close proximity to the gas jet openings 585. In the example illustrated in FIG. 3, the discharge needle 81 is disposed in the second manifold 584 inside the holder body 611 and generates the aforementioned ions by ionizing part of the inert gas in the second manifold 584 supplied from the gas supply part 73. The number of discharge needles 81 provided in the ion generator 8 may be one or two or more. In the case where the ion generator 8 includes a plurality of discharge needles 81, these discharge needles 81 are, for example, disposed circumferentially at approximately equiangular intervals in the second manifold 584.

Figure 7:
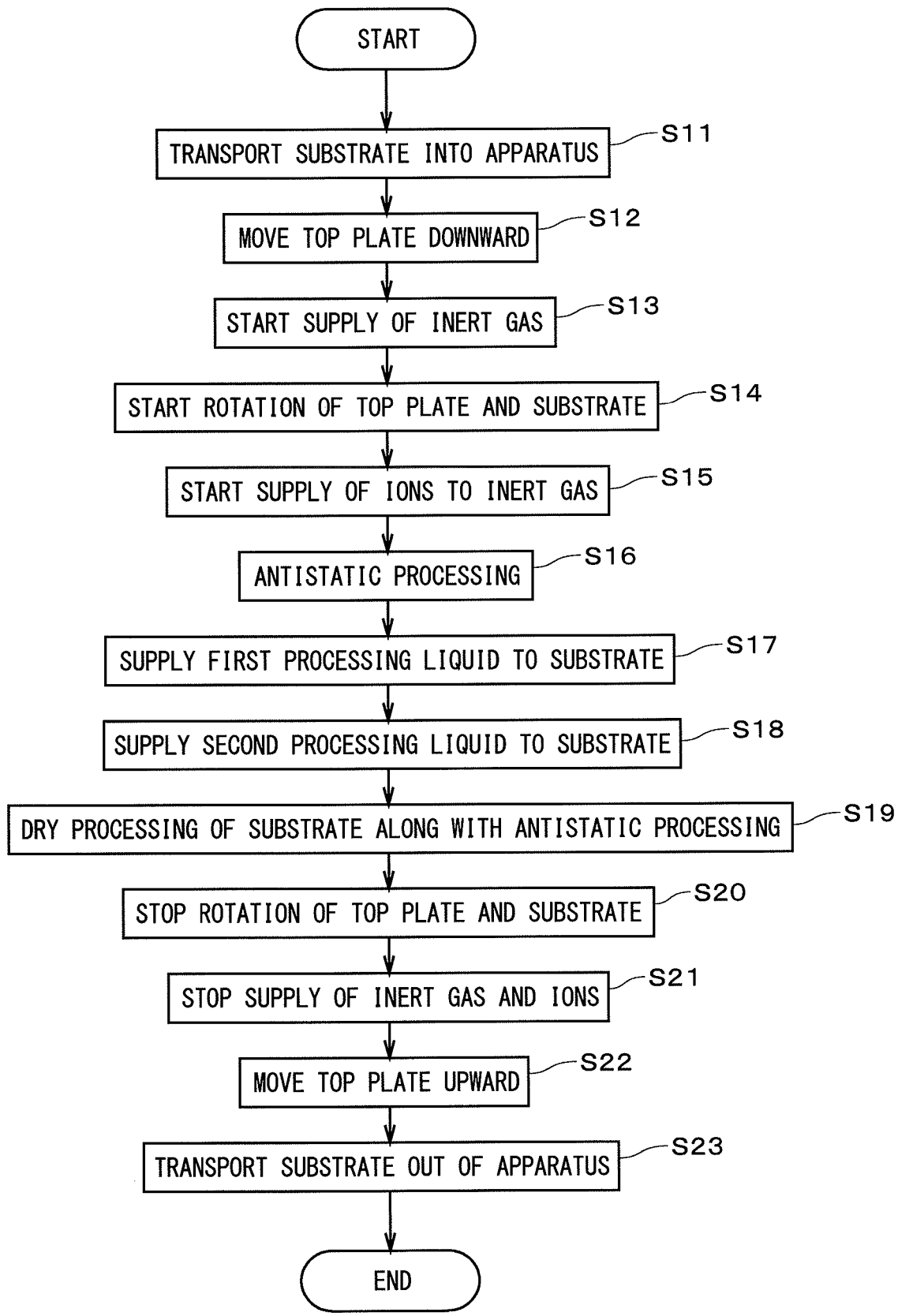
FIG. 7 illustrates a flow of processing that is performed on a substrate.

Next, one example of the flow of processing that is performed on the substrate 9 by the substrate processing apparatus 1 will be described with reference to FIG. 7. First, with the top plate 5 positioned at the first position in FIG. 1, the substrate 9 is transported into the housing 11 and held by the substrate holder 31 (step S11). At this time, the top plate 5 is held by the opposing member holder 61 of the opposing-member moving mechanism 6.

Then, the opposing member holder 61 is moved down by the opposing member elevating mechanism 62. Thus, the top plate 5 is moved down from the first position to a position lower than the position in step S11 (i.e., position when the substrate 9 is transported into the apparatus). Specifically, the top plate 5 is moved from the first position to the second position and held by the substrate holder 31 as illustrated in FIG. 2 (step S12). Also, the labyrinth 57 is formed between the top plate 5 and the opposing member holder 61 as illustrated in FIGS. 2 and 3.

Then, the gas supply part 73 is controlled by the controller 21 (see FIG. 5) so as to start the supply of an inert gas (i.e., treatment atmospheric gas) through the processing liquid nozzle 71 to the nozzle gap 56 and the processing space 90. The supply of an inert gas (i.e., seal gas) through the gas supply passage 58 illustrated in FIG. 3 to the labyrinth 57 is also started (step S13). The supply of the inert gas from the processing liquid nozzle 71 and the supply of the inert gas to the labyrinth 57 are continued even after step S13.

Next, the substrate rotation mechanism 33 illustrated in FIG. 2 is controlled by the controller 21 so as to start the rotation of the substrate holder 31, the substrate 9, and the top plate 5 (step S14). The ion generator 8 is also controlled by the controller 21 so as to start the generation of ions and the supply of the ions to the inert gas supplied from the gas supply part 73 (step S15). Specifically, the ion generator 8 illustrated in FIG. 3 supplied ions to the inert gas before the inert gas is supplied from the gas jet openings 585 to the labyrinth 57. The inert gas supplied from the gas jet openings 585 to the labyrinth 57 contains the ions. Step S15 may be performed before step S14, or may be performed in parallel with steps S13 and S14.

By performing steps S13 to S15 after step S12 in this way, part of the inert gas containing the aforementioned ions is supplied through the labyrinth 57 and the nozzle gap 56 to the radial central part of the processing space 90 while the substrate holder 31 and the top plate 5 are being rotated in a state in which the top plate 5 is positioned at the second position. This forms an ion stream (i.e., a stream of gas containing ions) that spreads radially outward from the radial central part of the processing space 90. The formation of the ion stream in the processing space 90 is carried out before the substrate 9 is processed with the processing liquid supplied from the processing liquid supply part 72, which will be described later.

There are cases in which a charged substrate 9 is transported into the substrate processing apparatus 1. The substrate 9 becomes charged by, for example, undergoing a dry process such as dry etching or plasma CVD (Chemical Vapor Deposition) before being transported into the substrate processing apparatus 1. Specifically, the aforementioned dry process causes charges to develop in devices that are formed in advance on the upper surface 91 of the substrate 9. As described above, the substrate processing apparatus 1 removes charges (so-called carry-on charges) that already exist at the time of transport into the substrate processing apparatus 1 from the substrate 9 by forming an ion stream in the processing space 90 that is the space between the upper surface 91 of the substrate 9 and the lower surface of the top plate 5.

In the substrate processing apparatus 1, the processing for removing carry-on charges from the substrate 9 by the ion stream (i.e., antistatic processing) is performed for a predetermined time period (step S16). If the lower surface of the top plate 5 illustrated in FIG. 3 also becomes charged in step S16, the ion stream also dissipates charges from the lower surface of the top plate 5. If the processing liquid nozzle 71 and the opposing-member cylindrical part 521 also become charged, the ion-containing inert gas that flows from the labyrinth 57 through the nozzle gap 56 to the processing space 90 dissipates charges from the processing liquid nozzle 71 and the opposing-member cylindrical part 521.

In the substrate processing apparatus 1, part of the inert gas (i.e., inert gas containing ions) supplied to the labyrinth 57 in step S16 flows radially outward inside the labyrinth 57. Thus, the nozzle gap 56 is sealed against the external space that is the space radially outward of the labyrinth 57. The inert gas flowing radially outward in the labyrinth 57 is supplied from the space between the opposing-member flange part 522 and the flange supporter 613 toward the radial central portion of the upper surface of the top plate 5 and flows radially outward from the radial central portion along the upper surface of the top plate 5. In other words, the ion-containing inert gas that flows out radially outward of the labyrinth 57 forms an upper ion stream that spreads radially outward from the radial central portion along the upper surface of the top plate 5. Thus, when the upper surface of the top plate 5 becomes charged, this upper ion stream dissipates charges from the upper surface of the top plate 5.

After the processing for removing carry-on charges from the substrate 9 is completed, a first processing liquid is supplied from the processing liquid supply part 72 to the processing liquid nozzle 71 and supplied through the opposing member opening 54 of the top plate 5 positioned at the second position illustrated in FIG. 2 to the central portion of the upper surface 91 of the rotating substrate 9 (step S17). The first processing liquid supplied from the processing liquid nozzle 71 to the central portion of the substrate 9 spreads radially outward from the central portion of the substrate 9 by the rotation of the substrate 9 and is applied to the entire upper surface 91 of the substrate 9. The first processing liquid is dispersed radially outward from the outer edge of the substrate 9 and received by the first guard 41 of the cup part 4. The position of the first guard 41 in the up-down direction in FIG. 2 is a position where the processing liquid from the substrate 9 is received, and is referred to as a "liquid receiving position" in the following description. The processing of the substrate 9 using the first processing liquid ends after the first processing liquid is applied to the substrate 9 for a predetermined time period. The first processing liquid is, for example, a chemical solution such as a polymer removing liquid or an etchant, and in step S17, chemical solution processing is performed on the substrate 9. The supply of the ion-containing inert gas to the labyrinth 57, the nozzle gap 56, and the processing space 90 is continued during the processing of the substrate 9 using the first processing liquid.

Figure 8:
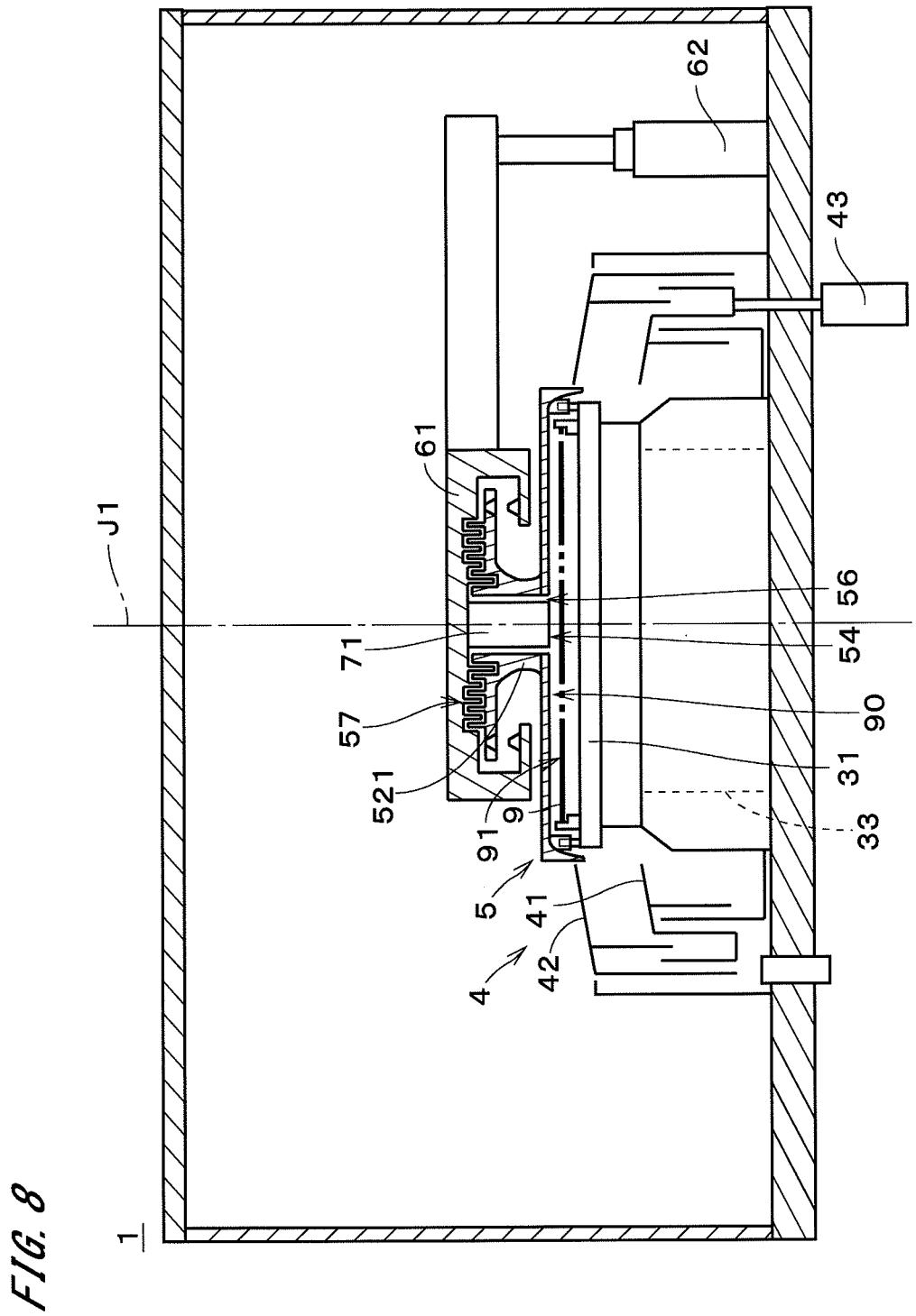
FIG. 8 is a sectional view of the substrate processing apparatus.

When the processing of the substrate 9 using the first processing liquid is completed, the supply of the first processing liquid from the processing liquid nozzle 71 is stopped. Then, the first guard 41 is moved down to a retracted position below the aforementioned liquid receiving position as illustrated in FIG. 8 by the guard moving mechanism 43. Accordingly, the guard that receives a processing liquid from the substrate 9 is switched from the first guard 41 to the second guard 42. That is, the guard moving mechanism 43 is a guard switching mechanism for switching the guard that receives a processing liquid from the substrate 9 between the first guard 41 and the second guard 42 by moving the first guard 41 in the up-down direction between the liquid receiving position and the retracted position.

Then, a second processing liquid is supplied from the processing liquid supply part 72 to the processing liquid nozzle 71 and supplied through the opposing member opening 54 of the top plate 5 positioned at the second position to the central portion of the upper surface 91 of the rotating substrate 9 (step S18). The second processing liquid supplied from the processing liquid nozzle 71 to the central part of the substrate 9 spreads radially outward from the central portion of the substrate 9 by the rotation of the substrate 9 and is applied to the entire upper surface 91 of the substrate 9. The second processing liquid is dispersed radially outward from the outer edge of the substrate 9 and received by the second guard 42 of the cup part 4. The processing of the substrate 9 using the second processing liquid ends after the second processing liquid is applied to the substrate 9 for a predetermined time period. The second processing liquid is, for example, a cleaning liquid such as deionized water or carbonated water, and in step S18, cleaning processing is performed on the substrate 9. The supply of the ion-containing inert gas to the labyrinth 57, the nozzle gap 56, and the processing space 90 is also continued during the processing of the substrate 9 using the second processing liquid.

When the processing of the substrate 9 using the second processing liquid is completed, the supply of the second processing liquid from the processing liquid nozzle 71 is stopped. Then, the flow rate of the inert gas that is jetted from the side surface of the processing liquid nozzle 71 toward the nozzle gap 56 by the gas supply part 73 is increased. The flow rate of the inert gas that is jetted from the lower end surface of the processing liquid nozzle 71 toward the processing space 90 is also increased. Moreover, the rotation speed of the substrate 9 rotated by the substrate rotation mechanism 33 is increased. Accordingly, the second processing liquid or other substances that remain on the upper surface 91 of the substrate 9 are moved radially outward, dispersed radially outward from the outer edge of the substrate 9, and received by the second guard 42 of the cup part 4. The substrate rotation mechanism 33 continues the rotation of the substrate 9 for a predetermined time period, so that dry processing for removing the processing liquid supplied from the processing liquid supply part 72 from above the upper surface 91 of the substrate 9 is performed (step S19).

In the dry processing in step S19, the top plate 5 and the substrate 9 rotate at high speed, and therefore the top plate 5 and the substrate 9 become charged by friction of the top plate 5 and the substrate 9 with air. In the substrate processing apparatus 1, the aforementioned formation of the ion stream in the processing space 90 is continuously carried out during the dry processing in step S19. Thus, charges are dissipated from the lower surface of the top plate 5 and the upper surface 91 of the substrate 9. In the substrate processing apparatus 1, the formation of the upper ion stream along the upper surface of the top plate 5 is also continuously carried out during the dry processing in step S19. Thus, charges are also dissipated from the upper surface of the top plate 5.

In the dry processing in step S19, the rotating opposing-member cylindrical part 521 also becomes charged by friction with air. Also, a circumferential air stream is generated in the nozzle gap 56 by the rotation of the opposing-member cylindrical part 521, and the processing liquid nozzle 71 also becomes charged by friction with this air stream. In the substrate processing apparatus 1, the ion-containing inert gas that flows from the labyrinth 57 to the processing space 90 dissipates charges from the opposing-member cylindrical part 521 and the processing liquid nozzle 71.

In this way, in the substrate processing apparatus 1, the antistatic processing for dissipating charges from the top plate 5, the substrate 9, and the processing liquid nozzle 71 is performed in parallel with the dry processing of the substrate 9 in step S19. Note that the antistatic processing for dissipating charges from the top plate 5, the substrate 9, and the processing liquid nozzle 71 in step S19 involves not only removing charges from the top plate 5, the substrate 9, and the processing liquid nozzle 71 by the supply of the ion-containing inert gas, but also preventing or suppressing the development of charges. The antistatic processing is, for example, continuously performed until the end of the dry processing of the substrate 9, and ends simultaneously with the end of the dry processing.

When the dry processing of the substrate 9 is completed, the rotation of the substrate holder 31, the substrate 9, and the top plate 5 by the substrate rotation mechanism 33 is stopped (step S20). Also, the supply of the inert gas from the gas supply part 73 to the nozzle gap 56, the processing space 90, and the labyrinth 57 is stopped. Moreover, the generation of ions by the ion generator 8 and the supply of the ions to the inert gas are also stopped (step S21). Next, the top plate 5 is moved up from the second position to the first position illustrated in FIG. 1 by the opposing-member elevating mechanism 62 moving the opposing member holder 61 upward (step S22). The top plate 5 is spaced above from the substrate holder 31 and held by the opposing member holder 61. Thereafter, the substrate 9 is transported out of the housing 11 (step S23). The substrate processing apparatus 1 performs the aforementioned steps S11 to S23 sequentially on a plurality of substrates 9, and the plurality of substrates 9 are sequentially processed.

As described above, the substrate processing apparatus 1 includes the substrate holder 31, the substrate rotation mechanism 33, the top plate 5, the processing liquid supply part 72, the gas supply part 73, the ion generator 8, and the controller 21. The substrate holder 31 holds the substrate 9 in a horizontal position. The substrate rotation mechanism 33 rotates the substrate holder 31 about the central axis J1 pointing in the up-down direction. The top plate 5 opposes the upper surface of the substrate 9 and rotates about the central axis J1. The processing liquid supply part 72 supplies processing liquids to the upper surface 91 of the substrate 9. The gas supply part 73 supplies a treatment atmospheric gas to the radial central part of the lower space that is the space below the top plate 5. The ion generator 8 generates and supplies ions to the treatment atmospheric gas supplied from the gas supply part 73. The controller 21 controls the substrate rotation mechanism 33, the gas supply part 73, and the ion generator 8 so that, in a state in which the top plate 5 is positioned lower than when the substrate 9 is transported into the apparatus, the treatment atmospheric gas containing ions is supplied to the aforementioned lower space to form an ion stream that spreads radially outward from the radial central part of the lower space while the substrate holder 31 and the top plate 5 are being rotated.

Accordingly, charges can be dissipated from the top plate 5 with a simpler structure than in the cases, for example, where X rays are applied to the top plate to dissipate charges from the top plate. As a result, the adhesion of particles or other substances to the top plate 5 can be prevented. Also, the occurrence of discharges between the top plate 5 and the substrate 9 can be prevented. Moreover, the prevention of discharges avoids the possibility that the supply of combustible chemical solutions or the like to the substrate 9 may be restricted.

The substrate processing apparatus 1 can also reduce the lower space and reduce the amount of the ion-containing treatment atmospheric gas to be supplied to the lower space by bringing the top plate 5 into close proximity to the substrate holder 31. Moreover, the ion-containing treatment atmospheric gas supplied to the lower space can approximately uniformly and speedily be spread radially outward from the radial central part of the lower space by rotating the top plate 5 and the substrate holder 31. This further reduces the amount of the treatment atmospheric gas necessary to form an ion stream. As a result, it is possible to dissipate charges from the top plate 5 while reducing the amount of the treatment atmospheric gas to be used.

As described above, the lower space where the ion stream is formed is the processing space 90 that is the space between the lower surface of the top plate 5 and the upper surface 91 of the substrate 9. The formation of the ion stream in the processing space 90 is carried out during the dry processing (step S19) for removing the processing liquid supplied from the processing liquid supply part 72 from above the substrate 9 by rotating the substrate 9 by the substrate rotation mechanism 33. This allows the dissipation of charges from the top plate 5 and the substrate 9 to be carried out during dry processing.

Also, the formation of the ion stream in the processing space 90 is carried out before the substrate 9 is processed with the processing liquid supplied from the processing liquid supply part 72 (step S17). This allows the dissipation of charges from the top plate 5 and the substrate 9 to be carried out before the supply of the processing liquid to the substrate 9. Thus, even if the substrate 9 transported into the substrate processing apparatus 1 has already become charged (i.e., if carry-on charges have already developed), it is possible to prevent or suppress the occurrence of discharges caused by the charges between the processing liquid supplied to the substrate 9 and the substrate 9. As a result, damage to the substrate 9 or other defective conditions caused by discharges between the processing liquid and the substrate 9 can be prevented or suppressed.

Moreover, in the substrate processing apparatus 1, the formation of the ion stream before processing of the substrate 9 with the processing liquid is carried out using the treatment atmospheric gas that is supplied to the processing space 90 at the time of the processing of the substrate 9 with the processing liquid. In this way, the same type of gas is used as the gas supplied to the processing space 90 during the antistatic processing (step S16) performed before processing using the processing liquid and as the gas supplied to the processing space 90 during the processing using the processing liquid (step S17) performed after the antistatic processing. This eliminates the need for the process of switching the gas to be supplied to the processing space 90 between step S16 and step S17. As a result, an increase in the time of processing the substrate 9 due to the antistatic processing in step S16 can be suppressed.

The substrate processing apparatus 1 further includes the opposing-member moving mechanism 6. The opposing-member moving mechanism 6 holds the top plate 5 and moves the top plate 5 relative to the substrate holder 31 in the up-down direction between the first position and the second position. When positioned at the first position, the top plate 5 is held by the opposing-member moving mechanism 6 and spaced above from the substrate holder 31. When positioned at the second position, the top plate 5 is held by the substrate holder 31 and rotated together with the substrate holder 31 by the substrate rotation mechanism 33.

In this way, when the top plate 5 is rotated the top plate 5 is spaced from the opposing-member moving mechanism 6. Thus, it is difficult to dissipate charges by, for example, grounding the top plate 5 via the opposing-member moving mechanism 6. In the substrate processing apparatus 1, an ion stream is formed in the lower space located below the top plate 5 as described above, making it easy to dissipate charges from the top plate 5, which is rotated together with the substrate holder 31 by the substrate rotation mechanism 33. Also, the substrate processing apparatus 1 has no need to include a mechanism for rotating the top plate 5 separately from the substrate rotation mechanism 33. This simplifies the structure of the apparatus.

In the substrate processing apparatus 1, the top plate 5 includes the opposing-member main body 51 and the opposing-member cylindrical part 521. The opposing-member main body 51 opposes the upper surface 91 of the substrate 9. The opposing-member main body 51 has the opposing member opening 54 in its radial central portion. The opposing-member cylindrical part 521 is a tubular portion that protrudes upward from the periphery of the opposing member opening 54 of the opposing-member main body 51. Also, the processing liquid supply part 72 includes the processing liquid nozzle 71. The processing liquid nozzle 71 is inserted in the opposing-member cylindrical part 521 and supplies processing liquids through the opposing member opening 54 to the upper surface 91 of the substrate 9. The treatment atmospheric gas that contains ions is supplied through the nozzle gap 56, which is the space between the processing liquid nozzle 71 and the opposing-member cylindrical part 521, to the aforementioned lower space. Thus, the ion-containing treatment atmospheric gas flowing through the nozzle gap 56 can be used to dissipate charges from the processing liquid nozzle 71. The ion-containing treatment atmospheric gas can also dissipate charges from the opposing-member cylindrical part 521.

As described above, the top plate 5 further includes the opposing-member flange part 522. The opposing-member flange part 522 annularly extends radially outward from the upper end of the opposing-member cylindrical part 521 and is held by the opposing-member moving mechanism 6. In a state in which the top plate 5 is positioned at the second position, the labyrinth 57 that communicates with the nozzle gap 56 is formed on the upper surface of the opposing-member flange part 522. Then, the ion-containing treatment atmospheric gas is supplied to the labyrinth 57 so as to seal off the nozzle gap 56 from the external space and to form the upper ion stream that spreads radially outward from the radial central portion along the upper surface of the top plate 5. Accordingly, charges can also be dissipated from the upper surface of the top plate 5.

In the substrate processing apparatus 1, the ion generator 8 includes the discharge needle 81 that generates ions by discharge. The top plate 5 further includes the first uneven part in which recessed portions and raised portions are alternately disposed concentrically on the upper surface of the opposing-member flange part 522. The opposing-member moving mechanism 6 includes the flange supporter 613, the holder body 611, and the second uneven part 615. The flange supporter 613 opposes the lower surface of the opposing-member flange part 522 in the up-down direction. The holder body 611 opposes the upper surface of the opposing-member flange part 522 in the up-down direction. In the second uneven part 615, recessed portions and raised portions are alternately arranged concentrically on the lower surface of the holder body 611. Then, in the state in which the top plate 5 is positioned at the second position, the raised portions of one of the first uneven part 55 and the second uneven part 615 are disposed inside the recessed portions of the other of the first uneven part 55 and the second uneven part 615 with a gap therebetween so as to form the labyrinth 57. The discharge needle 81 is disposed inside the gas jet openings 585 for the treatment atmospheric gas, formed in the upper surface of one recessed portion of the second uneven part 615.

By disposing the discharge needle 81 in close proximity to the gas jet openings 585 in this way, the supply of the ion-containing treatment atmospheric gas to the nozzle gap 56, the processing space 90, and the upper surface of the top plate 5 can be conducted while suppressing a decrease in ions over time. As a result, the dissipation of charges from the opposing-member cylindrical part 521 and the processing liquid nozzle 71, the dissipation of charges from the upper and lower surfaces of the top plate 5, and the dissipation of charges from the upper surface 91 of the substrate 9 can be conducted with efficiency.

In the substrate processing apparatus 1, the dissipation of charges by the ion stream does not necessarily have to be conducted before the processing of the substrate 9 with the processing liquid (step S16) and in parallel with the dry processing of the substrate 9 (step S19). For example, the substrate processing apparatus 1 may perform only either of the antistatic processing step S16 and the antistatic processing in step S19. As another alternative, instead of performing the antistatic processing in steps S16 and S19, the dissipation of charges by the ion stream may be conducted in the other states.

Also, the dissipation of charges by the ion stream does not necessarily have to be conducted after the transport of the substrate 9 into the apparatus. For example, the dissipation of charges from the top plate 5 and the substrate holder 31 may be conducted by the controller 21 controlling the substrate rotation mechanism 33, the gas supply part 73, and the ion generator 8 in a state in which the substrate 9 has not yet been transported into the apparatus (i.e., in a state in which the substrate holder 31 does not hold the substrate 9). Specifically, the ion-containing treatment atmospheric gas is supplied to the radial central part of the lower space below the top plate 5 while the substrate holder 31 and the top plate 5 are being rotated in the state in which the top plate 5 is positioned at the second position (i.e., in the state in which the top plate 5 is positioned lower than when the substrate 9 is transported into the apparatus). This forms an ion stream that spreads radially outward from the radial central part in the lower space that is the space between the top plate 5 and the substrate holder 31. As a result, the dissipation of charges from the top plate 5 and the substrate holder 31 can be conducted with a simple structure while reducing the amount of the treatment atmospheric gas to be used. This dissipation of charges is conducted, for example, during the maintenance of the substrate processing apparatus 1 or immediately before the transport of the substrate 9 into the substrate processing apparatus 1.

Next, another preferable example of the labyrinth will be described. Similarly to FIG. 3, FIG. 9 is an enlarged sectional view of part of the top plate 5 and the opposing-member moving mechanism 6 (the same applies to FIG. 10 described later). In the case of a labyrinth 57a illustrated in FIG. 9, a surface 553 that opposes the plurality of gas jet openings 585 (i.e., peripheral jet opening) is an inclined surface that is inclined downward to the radially outer side. To be more specific, in the first uneven part 55 of the top plate 5, the radially outer side surface 553 of one ring-shaped raised portion 552 located below the plurality of gas jet openings 585 is an inclined surface that is inclined downward to the radially outer side.

Thus, an ion-containing inert gas (i.e., seal gas) that is jetted from the plurality of gas jet openings 585 into the labyrinth 57a can easily be guided radially outward along the side surface 553 that is an inclined surface. As a result, the entry of the atmosphere in the external space into the labyrinth 57a can be suppressed even further. Also, since the inert gas jetted from each gas jet opening 585 to the side surface 553 spreads in the circumferential direction, the inert gas can also be supplied approximately uniformly to the regions among the plurality of gas jet openings 585 in the labyrinth 57a. As a result, circumferential uniformity of the pressure of the inert gas in the labyrinth 57a can be improved. Moreover, circumferential uniformity of the flow rate of the inert gas in the labyrinth 57a can be improved even further.

The substrate processing apparatus 1 described above may be modified in various ways.

For example, the generation of ions by the ion generator 8 may be stopped during the processing of the substrate 9 with the first and second processing liquids (steps S17 and S18). In this case, the treatment atmospheric gas that substantially does not contain ions generated by the ion generator 8 is supplied to the nozzle gap 56, the processing space 90, and the labyrinth 57 or 57a. Also, the ion-containing treatment atmospheric gas that is supplied to the nozzle gap 56, the processing space 90, and the labyrinth 57 or 57a during the antistatic processing in step S16 and the treatment atmospheric gas that is supplied to the nozzle gap 56, the processing space 90, and the labyrinth 57 or 57a in steps S17 and S18 may be different types of gas.

In the substrate processing apparatus 1, the discharge needle 81 of the ion generator 8 may be disposed in an area other than inside the holder body 611. For example, the discharge needle 81 may be provided inside the processing liquid nozzle 71 or in the flow passage between the processing liquid nozzle 71 and the gas supply part 73 so as to supply ions to the treatment atmospheric gas supplied from the processing liquid nozzle 71 to the processing space 90 and/or the nozzle gap 56. Also, the ion generator 8 may include any of various types of ion generating mechanisms other than the discharge needle 81.

The ion generator 8 does not necessarily have to ionize part of the treatment atmospheric gas supplied from the gas supply part 73. For example, the ion generator 8 may ionize a gas supplied from another supply part different from the gas supply part 73, and this ionized gas may be supplied to the treatment atmospheric gas supplied from the gas supply part 73. In this case, the gas ionized by the ion generator 8 and the treatment atmospheric gas may be different types of gas, or may be the same type of gas.

The labyrinth 57 or 57a does not necessarily have to be formed between the opposing-member flange part 522 of the top plate 5 and the holder body 611 of the opposing member holder 61. The shape and arrangement of the labyrinth 57 or 57a may be changed in various ways. For example, in the case where the opposing member holder 61 is retracted from above the top plate 5 and the processing liquid nozzle moved by the nozzle movement mechanism is inserted in the opposing-member cylindrical part 521 of the top plate 5 in the state in which the top plate 5 is positioned at the second position and held by the substrate holder 31, a labyrinth may be formed of a circumferential uneven part provided from the periphery of the upper end of the processing liquid nozzle and the first uneven part 55 of the top plate 5 on the upper surface of the opposing-member flange part 522. Also, the labyrinth 57 or 57a does not necessarily have to be formed only in the state in which the top plate 5 is positioned at the second position, and may be formed irrespective of the position of the top plate 5.

In the cases, for example, where the necessity of dissipating charges from the upper surface of the top plate 5 is not great, the substrate processing apparatus 1 does not necessarily have to form the upper ion stream that spreads along the upper surface of the top plate 5. In this case, as illustrated in FIG. 10, the holder body 611 of the opposing member holder 61 may have a plurality of gas suction ports 591 that are provided at the radially outer edge of a labyrinth 57b (i.e., the edge on the aforementioned external spaced side) and through which gases in the labyrinth 57b are sucked. The plurality of gas suction ports 591 are circumferentially disposed at approximately equiangular intervals in the upper surface of one recessed portion (i.e., bottom surface of the recessed portion) at the radially outer edge of the second uneven part 615. The plurality of gas suction ports 591 are connected to a suction part (not shown) through a suction passage 592 formed inside the opposing member holder 61. The plurality of gas suction ports 591 forms a peripheral suction port that is disposed circumferentially about the central axis J1 at the radially outer edge of the labyrinth 57b.

By driving this suction part, the gas in the labyrinth 57b is sucked through the peripheral suction port.

This suppresses the entry of the atmosphere in the external space into the radially inner side of the plurality of gas suction ports 591 in the labyrinth 57b. Also, the inert gas (i.e., seal gas) supplied from the plurality of gas jet openings 585 into the labyrinth 57b can more easily be guided radially outward. As a result, the entry of the atmosphere in the external space into the labyrinth 57b can be suppressed even further. The labyrinth 57b may have, for example, a single suction port having an approximately circular ring shape about the central axis J1 as a peripheral suction port, instead of the plurality of gas suction ports 591. The peripheral suction port (s) provided in the labyrinth 57b may be provided in the labyrinth 57a illustrated in FIG. 9.

The substrate processing apparatus 1 does not necessarily have to jet the treatment atmospheric gas from the side surface of the processing liquid nozzle 71.

The substrate processing apparatus 1 may include a mechanism for rotating the top plate 5 separately from the substrate rotation mechanism 33. In this case, in step S12, the top plate 5 does not necessarily have to be positioned at the second position and may be positioned lower than when the substrate 9 is transported into the apparatus (i.e., positioned lower than the position in step S11). In this state, the ion-containing treatment atmospheric gas is supplied to the radial central part of the lower space below the top plate 5 while the substrate holder 31 and the top plate 5 are being rotated. This forms an ion stream that spreads radially outward from the radial central part of the lower space. As a result, in the same manner as described above, the dissipation of charges from the top plate 5 and the substrate 9 or the dissipation of charges from the top plate 5 and the substrate holder 31 can be conducted with a simple structure while reducing the amount of the treatment atmospheric gas to be used.

The substrate processing apparatus 1 does not necessarily have to be provided with the nozzle gap 56 and the labyrinth 57, 57a, or 57b. For example, in the case where the mechanism for rotating the top plate 5 is provided separately from the substrate rotation mechanism 33 as described above, the processing liquid nozzle 71 may be fixed to the top plate 5 without having a gap on the side and may be rotated together with the top plate 5. In this case, the supply of the treatment atmospheric gas to the lower space below the top plate 5 is conducted, for example, from only the lower end surface of the processing liquid nozzle 71. Also, the ion generator 8 is provided inside the processing liquid nozzle 71 or in the flow passage between the processing liquid nozzle 71 and the gas supply part 73 and supplies ions to the treatment atmospheric gas supplied from the lower end surface of the processing liquid nozzle 71 to the lower space.

The configurations of the above-described preferred embodiments and variations may be appropriately combined as long as there are no mutual inconsistencies.

While the invention has been shown and described in detail, the foregoing description is in all aspects illustrative and not restrictive. It is therefore understood that numerous modifications and variations can be devised without departing from the scope of the invention.

REFERENCE SIGNS LIST

1 Substrate processing apparatus
5 Top plate
6 Opposing-member moving mechanism
8 Ion generator
9 Substrate
21 Controller
31 Substrate holder
33 Substrate rotation mechanism
51 Opposing member body
54 Opposing member opening
55 First uneven part
56 Nozzle gap
57, 57a, 57b Labyrinth
71 Processing liquid nozzle
72 Processing liquid supply part
73 Gas supply part
81 Discharge needle
90 Processing space
91 Upper surface (of substrate)
521 Opposing-member cylindrical part
522 Opposing-member flange part
585 Gas jet opening
611 Holder body
613 Flange supporter
615 Second uneven part
J1 Central axis
S11 to S23 Step

The invention claimed is:

1. A substrate processing apparatus for processing a substrate, comprising:
   a substrate holder that holds a substrate in a horizontal position;
   a substrate rotation mechanism that rotates said substrate holder about a central axis pointing in an up-down direction;
   an opposing member that opposes an upper surface of said substrate and rotates about said central axis;
   an opposing-member moving mechanism that holds said opposing member and moves said opposing member relative to said substrate holder between a first position and a second position in the up-down direction;
   a processing liquid supply part that supplies a processing liquid to said upper surface of said substrate;
   a gas supply part that supplies a treatment atmospheric gas to a radial central part of a lower space that is a space below said opposing member;
   an ion generator that generates and supplies ions to said treatment atmospheric gas supplied from said gas supply part; and
   a controller that controls said substrate rotation mechanism, said gas supply part, and said ion generator to, in a state in which said opposing member is positioned lower than when said substrate is transported into the apparatus, supply said treatment atmospheric gas that contains said ions to said lower space and form an ion stream that spreads radially outward from the radial central part of said lower space, while rotating said substrate holder and said opposing member,
   wherein said opposing member, when positioned at said first position, is held by said opposing-member moving mechanism and spaced above from said substrate holder, and said opposing member, when positioned at said second position, is held by said substrate holder and rotated together with said substrate holder by said substrate rotation mechanism, and
   wherein said opposing member includes:
   an opposing-member main body that opposes said upper surface of said substrate and has an opposing member opening in a radial central portion thereof; and an opposing-member cylindrical part that protrudes upward from a periphery of said opposing member opening of said opposing-member main body, said processing liquid supply part includes a processing liquid nozzle that is inserted in said opposing-member cylindrical part and supplies said processing liquid to said upper surface of said substrate through said opposing member opening, when said processing liquid nozzle is inserted in said opposing-member cylindrical part, a nozzle gap that is a space between said processing liquid nozzle and said opposing-member cylindrical part is formed, and said treatment atmospheric gas that contains said ions is supplied to said lower space through said nozzle gap.

2. The substrate processing apparatus according to claim 1, wherein said lower space where said ion stream is formed is a processing space that is a space between a lower surface of said opposing member and said upper surface of said substrate; and the formation of said ion stream is carried out at a time of dry processing for removing said processing liquid supplied from said processing liquid supply part from above said substrate by rotation of said substrate via said substrate rotation mechanism.

3. The substrate processing apparatus according to claim 2, wherein said lower space where said ion stream is formed is a processing space that is a space between a lower surface of said opposing member and said upper surface of said substrate, and the formation of said ion stream is carried out before processing of said substrate with said processing liquid supplied from said processing liquid supply part.

4. The substrate processing apparatus according to claim 3, wherein the formation of said ion stream before processing of said substrate with said processing liquid is carried out using said treatment atmospheric gas that is supplied at a time of processing of said substrate with said processing liquid.

5. The substrate processing apparatus according to claim 1, wherein said opposing member further includes an opposing-member flange part that annularly extends radially outward from an upper end of said opposing-member cylindrical part and that is held by said opposing-member moving mechanism, in a state in which said opposing member is positioned at said second position, a labyrinth seal that communicates with said nozzle gap is formed above an upper surface of said opposing-member flange part, and said nozzle gap is sealed against an external space by supplying said treatment atmospheric gas that contains said ions to said labyrinth seal, and said treatment atmospheric gas that contains said ions and that flows out of said labyrinth seal forms an upper ion stream that spreads radially outward from the radial central portion along an upper surface of said opposing member.

6. The substrate processing apparatus according to claim 5, wherein said ion generator includes a discharge needle that generates ions by discharge, said opposing member further includes a first uneven part in which a recessed portion and a raised portion are alternately disposed concentrically on said upper surface of said opposing-member flange part, said opposing-member moving mechanism includes:

a holder lower part that opposes a lower surface of said opposing-member flange part in the up-down direction;

a holder upper part that opposes said upper surface of said opposing-member flange part in the up-down direction; and a second uneven part in which a recessed portion and a raised portion are alternately disposed concentrically on a lower surface of said holder upper part, in a state in which said opposing member is positioned at said second position, said labyrinth seal is formed by disposing the raised portion of one of said first uneven part and said second uneven part within the recessed portion of the other of said first uneven part and said second uneven part with a gap therebetween, and within said holder upper part, said discharge needle is disposed inside a jet opening through which said treatment atmospheric gas is jet and that is formed in an upper surface of the recessed portion of said second uneven part.

7. The substrate processing apparatus according to claim 1, wherein said lower space where said ion stream is formed is a processing space that is a space between a lower surface of said opposing member and said upper surface of said substrate, and the formation of said ion stream is carried out before processing of said substrate with said processing liquid supplied from said processing liquid supply part.

8. The substrate processing apparatus according to claim 7, wherein the formation of said ion stream before processing of said substrate with said processing liquid is carried out using said treatment atmospheric gas that is supplied at a time of processing of said substrate with said processing liquid.

* * * * *